(12) United States Patent
French et al.

(10) Patent No.: US 7,589,242 B2
(45) Date of Patent: Sep. 15, 2009

(54) USE OF HIGHLY PURIFIED HYDROCARBONS IN VACUUM ULTRAVIOLET APPLICATIONS

(75) Inventors: Roger Harquail French, Wilmington, DE (US); Sheng Peng, Wilmington, DE (US); Robert Clayton Wheland, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 380 days.

(21) Appl. No.: 11/141,285

(22) Filed: Sep. 14, 2005

(65) Prior Publication Data

US 2005/0286031 A1   Dec. 29, 2005

Related U.S. Application Data

(60) Provisional application No. 60/575,982, filed on Jun. 1, 2004, provisional application No. 60/614,747, filed on Sep. 29, 2004, provisional application No. 60/647,218, filed on Jan. 26, 2005.

(51) Int. Cl.
*C10M 105/02* (2006.01)
*G03C 1/00* (2006.01)
(52) U.S. Cl. ............... 585/1; 585/16; 585/20; 585/21; 585/22; 430/270.1
(58) Field of Classification Search ........ 585/1, 585/16, 20, 21, 22
See application file for complete search history.

(56) References Cited

U.S. PATENT DOCUMENTS

| 4,390,273 | A | | 6/1983 | Loebach et al. |
| 4,988,446 | A | * | 1/1991 | Haberman et al. .......... 210/656 |
| 5,076,909 | A | * | 12/1991 | Overfield et al. ............ 208/177 |
| 5,900,354 | A | | 5/1999 | Batchelder et al. |
| 6,881,531 | B2 | * | 4/2005 | Matsuzawa .............. 430/270.1 |
| 6,927,010 | B2 | * | 8/2005 | Matsuzawa .............. 430/270.1 |
| 7,317,507 | B2 | * | 1/2008 | Straaijer ...................... 355/53 |
| 7,402,377 | B2 | * | 7/2008 | French et al. ............... 430/311 |
| 7,435,528 | B2 | | 10/2008 | Peng et al. |
| 2005/0161644 | A1 | * | 7/2005 | Zhang et al. ................ 252/582 |
| 2005/0173682 | A1 | * | 8/2005 | Zhang et al. ................ 252/582 |
| 2007/0229795 | A1 | * | 10/2007 | Zhang et al. .................. 355/77 |

FOREIGN PATENT DOCUMENTS

EP    1431710 A    6/2004
EP    1489462 A    12/2004

(Continued)

OTHER PUBLICATIONS

Switkes et. al., Immersion Lithography, J. Vac. Sci. Technol. B, Nov./Dec. 2001, vol. 19:2353-2356.

(Continued)

*Primary Examiner*—Ellen M McAvoy
(74) *Attorney, Agent, or Firm*—Gail D. Tanzer

(57) ABSTRACT

The present invention is drawn to the use of alkanes that are highly transparent to UV wavelengths ranging from about 170 nm to 260 nm in optical couplants, optical cements, optical elements, optical inspection media for semiconductor wafers and devices, and immersion photolithography, particularly at 193 and 248 nm exposure wavelength.

4 Claims, 14 Drawing Sheets

FOREIGN PATENT DOCUMENTS

| | | | |
|---|---|---|---|
| EP | 1491957 A | | 12/2004 |
| EP | 1580598 A | | 9/2005 |
| WO | WO 2005/013009 A1 | * | 2/2005 |
| WO | 2005/050324 | | 6/2005 |
| WO | 2005/059617 | | 6/2005 |
| WO | 2005/062128 | | 7/2005 |
| WO | 2005/087693 | | 9/2005 |
| WO | WO 2005/087693 A2 | * | 9/2005 |
| WO | WO 2005/199371 A1 | * | 12/2005 |

OTHER PUBLICATIONS

Switkes et. al., Immersion Lithography: Beyond the 65NM Node With Optics, Microlithography World, 2003, p. 4-8.

B.A. Lombos et. al., The Electronic Spectra of Normal Paraffin Hydrocarbons, Chemical Physics Letters, 1967, vol. 1:42-43.

G. Belanger et. al., The Far-Ultraviolet Spectra of Perfluoro Normal Paraffins, Chemical Physics Letters, 1969, vol. 3:649-651.

K. Seki et. al., Electronic Structure of Poly(tetrafluoroethylene) Stuided by UPS, VUV, Absorption, and Band Calculations, Phys. Scripta, 1990, vol. 41:167-171.

P. Crews et. al., Optical and Chiroptical Techniques: Ultraviolet Spectroscopy, Organic Structure Analysis, 1998, pp. 349-357, Chapter 9.

Patent Abstracts of Japan, vol. 2000, No. 01, Jan. 31, 2000 & JP 11 269317, Oct. 5, 1999, Nikon Corp.

Patent Abstracts of Japan, vol. 2002, No. 06, Jun. 4, 2002 & JP 2002 053839, Feb. 19, 2002, Nikon Corp.

Kawata H et al, "Fabrication of 0.2 MM Fine Patters Using Optical Projection Lithography with an Oil Immersion Lens", Japanese Journal of Applied Physics, Japan Society of Applied Physics, Dec. 1, 1992, Tokyo, JP, vol. 31, No. 12B, Part 1: 4174-4177.

Dammel R R et al., "193 NM Immersion Lithography - Taking the Plunge", Journal of Photopolymer Science and Technology, Chiba, JP, vol. 17, No. 4, May 19, 2004: 587-602.

Kunz R R et al., "Transparent Fluids for 157-NM Immersion Lithography", Journal of Microlithography, Microfabrication and Microsystems, Society of Photo-Optical Instrumentation Engineers, Bellingham, US, vol. 3, No. 1, Jan. 1, 2004: 1537-1646.

Burnett et al., Absolute Refractive Indices and Thermal Coefficients of $CaF_2$, $SrF_2$ and LiF Near 157 NM, Appl. Opt. 41, 2002, 2508-2513.

French et al., "Immersion Fluid Refractive Indices Using Prism Minimum Deviation Techniques", Optical Microlithography XVII, SPIE, vol. 5377, 2004: 1689-1694.

Crawford et al., "Single Layer Fluoropolymer Resists for 157 NM Lithography", Advances in Resist Technology and Processing XX, SPIE, vol. 5039, 2003: 80-92.

Feiring et al., "Design of Very Transparent Fluoropolymer Resists for Semiconductor Manufacture at 157 NM", Journal of Fluorine Chemistry 122, 2003: 11-16.

* cited by examiner

USE OF HIGHLY PURIFIED HYDROCARBONS IN VACUUM ULTRAVIOLET APPLICATIONS

FIELD OF THE INVENTION

The present invention is directed to alkanes that are transparent to UV wavelengths ranging from about 170 nm to 260 nm in optical couplants, optical cements, optical elements, optical inspection media for semiconductor wafers and devices, and immersion photolithography, particularly at 193 and 248 nm exposure wavelength. The alkanes are useful in vacuum and deep ultraviolet applications where increased transparency to lower-wavelength ultraviolet radiation is desired.

BACKGROUND OF THE INVENTION

Much progress in the electronics industry comes from circuit size reduction. This is most directly accomplished by running photolithographic processes at ever-shorter wavelengths of light. Processes using 193 nanometer (nm) light are undergoing commercialization while 157 nm wavelength light is under development as a next generation candidate.

In immersion photolithography (Switkes et al, *J. Vac. Sci. Technol. B,* 19 (6), 2353 6, November/December 2001) an optical source and a target surface are immersed in a highly transparent high refractive index liquid. As shown by Switkes et al *Microlithography World*, May 2003, pp. 4ff, higher resolution in photolithography can be achieved at a given wavelength of incident light when a high refractive index transmission medium is employed. Realization of the potential benefits of this technology is dependent upon identifying high refractive index liquids having high transparency in the VUV/DUV and excellent photochemical stability.

All known organic materials absorb to some extent UV radiation of 193 nm. The issue is whether liquids can be found that are sufficiently transparent to be practical. Short chain alkanes $H(CH_2)_nH$ and short chain fluorocarbons $F(CF_2)_nF$ are relatively transparent compared to their longer-chain homologues at 193 nm, as disclosed, for example, in B. A. Lombos et al, Chemical Physics Letters, 1, 42 (1967); G. Belanger et al, *Chemical Physics Letters,* 3(8), 649(1969); and K. Seki et al, *Phys. Scripta,* 41, 167(1990).

Although fluorinated species are known to be transparent to UV radiation of some useful wavelengths, and fluorination can decrease absorbance, fluorinated molecules can exhibit low refractive indices about, e.g., about 1.3, which is undesirably low immersion lithography at 193 nm.

Gaseous materials may be highly transparent, can have lower than desired refractive indices. Liquids with low boiling points similarly can have an undesirably low refractive index and require a pressure vessel for containment.

Crews, P.; Rodriguez, J.; Jaspars, M., *Organic Structure Analysis*. ed.; Oxford University Press: 1998; p 353 discloses 200 nm as the short wavelength cut-off for transparency in cyclohexane.

SUMMARY OF THE INVENTION

The present invention provides a liquid alkane having an oxygen concentration less than 2 ppm and an absorbance at 193 nm wavelength of $\leq 1$ cm$^{-1}$.

The present invention further provides a process comprising providing a light source that emits UV radiation having a wavelength from about 170 to about 260 nm, providing a target surface, illuminating at least a portion of the target surface with UV radiation directed along a path from the light source, and disposing in at least a portion of the path thethea liquid alkane. The liquid alkane consists essentially of acylic or cyclic alkanes, which can be branched or unbranched. The liquid alkane can contain mixtures of cyclic and acyclic, branched and unbranched, alkanes and any combinations thereof.

The present invention further provides an apparatus comprising a light source emitting light having a wavelength from about 170 to about 260 nm, a surface disposed so that upon activation of the light source the at least a portion of the surface is illuminated by the light emitted from the light source, and a liquid alkane disposed between the light source and the surface such that at least a portion of the emitted light illuminating the surface is transmitted through the liquid alkane. The liquid alkane consists essentially of acylic or cyclic alkanes, which can be branched or unbranched. The liquid alkane can contain mixtures of cyclic and acyclic, branched and unbranched, alkanes and any combinations thereof.

DETAILED DESCRIPTION

Figure 1:
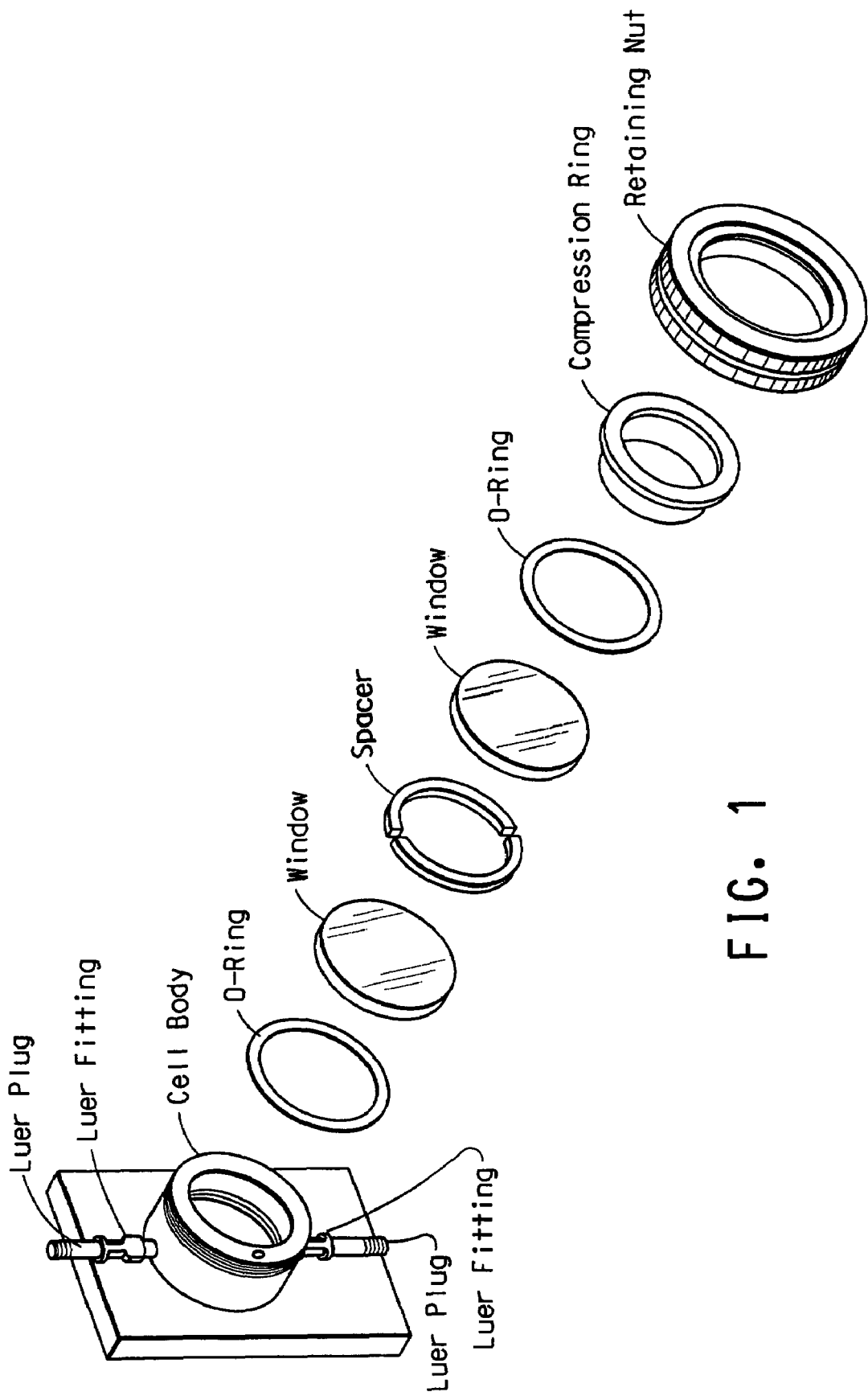
FIG. 1 is a schematic drawing of a Harrick DLC liquid specimen cell, showing the annular spacers, windows and related parts.

The present inventors have discovered that a liquid alkane, consisting essentially of acylic and/or cyclic alkanes, branched and/or unbranched alkanes, or a mixture thereof shows surprisingly high suitability for use in imaging applications in the wavelength range of about 170-260 nm (the vacuum ultra-violet—VUV), particularly 193 and 248 nm, as well as other applications requiring high transparency condensed phase optical components such as optical adhesive compositions, solvents for pellicle polymers, index matching fluids and the like. Of particular note is the suitability thereof in the emerging field of immersion photolithography at 193 nm exposure wavelength, wherein at least the target surface in a photolithographic apparatus such as is widely employed in the art of microcircuit fabrication is partially or wholly immersed in a liquid of high transparency and higher refractive index than air or other gaseous atmospheres. Preferably the target surface is wholly immersed.

The liquid alkane preferably consists essentially of acylic or cyclic alkanes, branched or unbranched, or a mixture thereof. The transparency and high photochemical stability of the liquid alkanes provide particularly high suitability for use in immersion photolithography in the vacuum ultraviolet/deep ultraviolet (VUV/DUV) region of the electromagnetic spectrum.

The terms "imaging," "imaging applications," "image-wise", as used herein, refer to aformation of an image on a substrate by a photoactivated process comprising providing a light source having wavelengths within the range from about 170 to about 260 nm, preferably from about 193 to about 248 nm, illuminating at least a portion of a surface by the emitted light, and disposing a liquid alkane between the light source and the surface such that at least a portion of the emitted light illuminating the surface is caused to be transmitted through the liquid, wherein the liquid consists essentially of acylic or cyclic alkanes, branched or unbranched, or a mixture thereof. There is no limitation on the shape of the image formed, and the image can include a completely masked and/or a completely unmasked surface. The terms "light" and "radiation" are used herein interchangeably to refer to non-ionizing electromagnetic radiation, in the wavelength range from 170-260 nanometers, most particularly at 193 and 248 nm, and are not intended to include ionizing radiation.

Unless otherwise stated, concentrations expressed herein as parts per million (ppm) refer to parts per million by weight on the basis of the total weight of the composition referred to.

When an amount, concentration, or other value or parameter is recited herein as either a range, preferred range or a list of upper preferable values and lower preferable values, the recited amount, concentration, or other value or parameter is intended to include all ranges formed from any pair of any upper range limit or preferred value and any lower range limit or preferred value, regardless of whether such ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

The term "heart cut" is used herein in reference to a fractional distillation, to refer to that portion of a condensate that is collected when the temperature of the condensate has reached a plateau.

The term "oxygen-minimized" is used herein to refer to the atmosphere within which the liquid alkanes are handled and maintained. The term "oxygen-minimized", as used herein, means that steps are taken to reduce the contamination by atmospheric oxygen of the liquid alkanes. Oxygen is undersirable in the liquid alkanes when stored, because slow oxidation can generate chromophores that absorb at 193 nm. Moreover, oxygen is undersirable in the liquid alkane during exposure because 193 nm light can interact with oxygen to create ozone.

The term alkane, as used herein, refers to a liquid consisting essentially of acylic or cyclic alkanes, branched or unbranched, or any mixture or combination thereof. Suitable cyclic alkanes can contain one or more cyclobutane or larger rings of any size, with or without branches, and can be interconnected in any fashion including linear, fused, bicyclic, polycyclic, and spiro arrangements.

The alkanes exhibit transparency in the VUV which, when combined with high photochemical stability and inherently high refractive index, are highly suitable for use as immersion fluids in immersion photolithography. Preferred liquid alkanes have an absorbance from 0.01 to 1 $cm^{-1}$ at 193 nm, and an oxygen concentration of <2 ppm. Preferred alkanes include cyclopentane, cyclohexane, cycloheptane, cyclooctane, decane, decahydronaphthalene racemate, cis-decahydronaphthalene, trans-decahydronaphthalene, exo-tetrahydrodicyclopentadiene, 1,1'-bicyclohexyl, 2-ethylnorbornane, n-octyl-cyclohexane, dodecane, tetradecane, hexadecane, 2-methyl-pentane, 3-methyl pentane, 2,2-dimethyl butane, 2,3-dimethyl butane, octahydroindene, and mixtures thereof.

More preferred alkanes have an absorbance from 0.01 to 0.5 $cm^{-1}$ at 193 nm and an oxygen concentration of <2 ppm. More preferred alkanes include but are not limited to cyclopentane, cyclohexane, cycloheptane, cyclooctane, n-decane, decahydronaphthalene racemate, cis-decahydronaphthalene, trans-decahydronaphthalene, exo-tetrahydrodicyclopentadiene, 1,1'-bicyclohexyl, 2-ethylnorbornane, n-dodecane, n-tetradecane, n-hexadecane, 2-methyl-pentane, 3-methyl pentane, 2,2-dimethyl butane, 2,3-dimethyl butane, octahydroindene, and mixtures thereof.

Most preferred alkanes are cyclopentane, cyclohexane, decahydronaphthalene racemate, cis-decahydronaphthalene, trans-decahydronaphthalene, exo-tetrahydrodicyclopentadiene, 1,1'-bicyclohexyl, and mixtures thereof.

The present invention further provides a process comprising providing a light source that emits UV radiation having a wavelength from about 170 to about 260 nm, providing a target surface, illuminating at least a portion of the target surface with UV radiation directed along a path from the light source, and disposing in at least a portion of the path thethea liquid alkane. The liquid alkane consists essentially of acylic or cyclic alkanes, which can be branched or unbranched. The liquid alkane can contain mixtures of cyclic and acycial, branched and unbranched, alkanes and any combinations thereof.

In some preferred embodiments, the light source emits light at 193 or 248 nm. More preferably the light source is a laser. In some highly preferred embodiments, the light source is an ArF excimer laser emitting light at 193 nm. Other suitable light sources include but are not limited to lamps such as gas discharge lamps of deuterium, xenon, or halogen, laser plasma light sources, and frequency shifted lasers, such as frequency doubled or tripled laser light sources.

Preferably the surface is a photoresist surface. More preferably the photoresist surface resides on a silicon wafer. Still more preferably the illumination is an imagewise exposure of the preferred photoresist surface. Most preferably the photoresist surface is immersed in the liquid alkane. It will be understood by one of skill in the art that the liquid alkane is generally regarded as a "good solvent" for many organic species. In some cases, depending largely upon the specific choice of the photoresist or other surface material, the resist might partially or completely dissolve in, or be swollen by or otherwise damaged by and reduce the transparency of the liquid alkane. In such cases a protective topcoat can be applied to the resist. The topcoat is preferably optically uniform, transparent to 193 and 248 nm light, adherent to the resist, insoluble in the immersion fluid, and easily deposited and later removed in the process of immersion photolithography that leaves the underlying resist and the latent image in the resist (which is present in the resist after exposure and before development of the photoresist) undamaged.

Suitable topcoats include highly fluorinated polymers that are soluble in highly fluorinated solvents. Highly fluorinated solvents are an important element of the process of preparing a topcoat because they do not disturb most photoresist compositions. Suitable topcoat polymers include the homopolymer of perfluorobutenylvinyl ether {1,1,2,3,3,4,4-heptafluoro-4-[(trifluoroethenyl)oxy]-1-butene} or amorphous soluble copolymers of two or more monomers such as tetrafluoroethylene (TFE), hexafluoropropylene (HFP), perfluorodimethyldioxole [4,5-difluoro-2,2-bis(trifluoromethyl)-1,3-dioxiole], and perfluoro alkyl vinyl ethers such as pertluoromethylvinyl ether and perfluoropropylvinylether. The recited copolymers may also include small amounts of termonomers including vinylidene fluoride, vinyl fluoride, trifluoroethylene, 3,3,3-trifluoropropene, 3,3,3,2-tetrafluoropropene, and hexafluoroisobutylene [3,3,3-trifluoro-2-(trifluoromethyl)propene], but not so much of these monomers that the polymers are no longer soluble in the desired highly fluorinated solvents. Preferred fluorinated solvents include Fluorinert™ FC-75, Fluorinert™ FC-40, Performance Fluid™ PF-5080, perfluorobutyltetrahydrofuran, perfluorotributylamine, perfluorooctane, perfluoroalkanes, and perfluorodecahydronapthalene. Preferred topcoat polymers are Teflon™ AF, available from the DuPont Company, Wilmington Del., Cytop™, 40-60:60:40 poly(hexafluoropropylene:tetrafluoroethylene), and poly(perfluorodimethyldioxole:perfluoropropylvinyl ether).

To prepare the liquid alkane, a commercial highly purified liquid alkane is treated to ensure that oxygen concentration does not exceed 2 parts per million by weight (ppm). Further the as-received liquid alkane is subject to treatment to remove trace organic contaminants. The so-treated liquid alkane exhibits absorbance in the range of 0.01 to 1.cm$^{-1}$ at 193 nm. In a most preferred embodiment of the present invention, the oxygen concentration of the liquid alkane after treatment does not exceed 1 ppm. Also, in a most preferred embodiment, the liquid alkane of the invention has an absorbance of 0.01 to 0.5 cm$^{-1}$ at 193 nm. $E_0$ (clearing dose) and $E_1$ (exposure dose) are figures of merit employed in the integrated circuit industry. The extremely low absorption of the liquid alkane translates into desirably low levels of $E_0$ and $E_1$, which in turn translate into higher productivity at fixed laser fluence. In this sense the lower optical absorbance reduces the cost of the lithography, while at the same time the high refractive indices of the liquid alkanes allow the further reduction of printed feature sizes. The term "$E_0$" clearing dose is a term of art that refers to the open field incident optical energy exposure at which the photoresist will be completely removed after exposure and subsequent aqueous base development. The term "$E_1$" exposure dose is a term of art that refers to the incident optical energy exposure at which the photoresist will have patterned features of the desired size, as produced from the pattern of the photomasks, after exposure and subsequent aqueous base development.

Cyclohexane and cyclopentane are available commercially in highly purified grades (99.9% or higher). For example highly purified cyclohexane is available from Fluka. Prior to the present invention, use of even the highly purified commercial grades of these materials for immersion photolithography at 193 nm exposure wavelength was not contemplated because even in the available highly pure form, the absorbance was too high.

The inventors have found that the VUV absorbance of commercially available highly pure alkanes can be reduced significantly with further treatment. The degree to which further treatment of an as-received sample is necessary depends upon the degree to which the absorbing impurities have been removed at the commercial source. Outlined herein are methods for purifying liquid alkanes, which have been found to be useful in preparing the liquid alkanes for use in the processes disclosed herein. As will be understood by one skilled in the art, not all of the methods of purification will be necessary in all cases.

Certain organic impurities such as aromatic rings, olefins, substituted cycloalkanes, branched alkanes oxidation products such as peroxides and ketones, and the like may be present in an alkane as received from a commercial source. Some organic impurities are orders of magnitude more absorbing than other organic impurities such as cyclobutane. So, for example, an alkane contaminated by a percent or two of cyclobutane, which is quite transparent though of high vapor pressure and low refractive index, may be suitable for use in the processes disclosed herein. On the other hand, it may be desirable that the concentration of more highly absorbing contaminants, such as olefins and carbonyls, be on the order of 1 ppm or even less.

Highly absorbing contaminants can be removed from an alkane by such methods as fractional distillation, sparging, freeze-thaw cycling, zone refining, and treatment with adsorbents such as silica, molecular sieves of various pore sizes, carbon, silica gel, alumina, or mixtures thereof.

Preferably, the liquid alkane exhibits absorbance of 0.01 to 1 cm$^{-1}$ at 193 nm, more preferably 0.01 to 0.5 cm$^{-1}$. One of skill in the art will appreciate that there is no lower limit to the absorbance, which is preferably as low as possible, provided the oxygen concentration is desirably low. In a most preferred embodiment of the invention, the liquid alkane exhibits absorbance at 193 nm in the range of 0.01 to 0.5 cm$^{-1}$. It will be appreciated by one of skill in the art that at purity levels required to achieve this result, the most sensitive measurement of contamination is the spectroscopic absorption itself. In other words the best way to tell that the most important impurities have been removed is to measure the absorbance. Absorbance below 1 cm$^{-1}$ is by far the most sensitive available indicator of purity in regard to trace amounts of absorbers. Absorbance achieved in the present invention is lower by about 90% or more than that previously known. Thus the term "absorbance" refers to two related phenomena. On the one hand, the term "absorbance" refers to the actual absorbance of the liquid alkane in actual use in the processes disclosed herein, which can be affected by external influences such as the solubility of a photoresist in the liquid alkane, as discussed hereinabove. On the other hand, "absorbance" also refers to the analytical spectroscopic method employed to determine the absolute absorbance of the liquid alkane under laboratory conditions. The latter is a highly desirable method for evaluating the concentration of contaminating adsorbents in a liquid alkane being tested.

It has been found in the practice of the present invention that silica gel is a highly effective adsorbent of very small amounts of organic contamination in the liquid alkane. Large improvements in transparency have been observed when the as-received alkane has been treated with silica gel.

In some embodiments, particularly if the commercial supplier has not already done so, it may be desirable to first subject the as-received alkane, which is generally of purity greater than 99%, to fractional distillation in the cleanest possible, grease-free distillation apparatus. The heart cut of the distillate thus produced is then mixed in the liquid state with a mixture of adsorbents, which may include, for example, silica gel, 3A, and 5A zeolite molecular sieves, alumina, or activated carbon. All subsequent handling of the thus purified alkane is then performed in an oxygen-minimized atmosphere, preferably an inert gas atmosphere, most preferably a helium or nitrogen atmosphere. This includes the use thereof in immersion photolithography, which is preferably performed in an oxygen-minimized atmosphere.

Silica gel and zeolite adsorbents are most effective if activated, preferably by heating while purging with a dry gas flow. It is preferable that adsorbent activation be done immediately prior to use. Activation can be achieved by heating to about 200 to 500° C. under a flow of dry, pure air, nitrogen, or helium for several hours. Air at 500° C. has the advantage of burning most residual organic contaminants off an adsorbent such as a silica gel or a zeolite. The gas flow can be continued as the system cools down to a temperature in the range of room temperature to 100° C. In an alternative procedure the gas flow is stopped and the system sealed off. In another alternative procedure, the gas flow is stopped and the system evacuated as the adsorbent cools to a temperature in the range of room temperature to 100° C. The advantage of stopping the gas flow while the adsorbent is at 500° C. is that this minimizes recontamination from any adventitious impurities in the gas as the adsorbent cools down.

A preferred method of activating the silica gel and zeolite adsorbents is the following. A Hastelloy® tube in a clamshell furnace is loaded with adsorbent and then heated under an air flow for two hours at 500° C. The airflow is stopped and the Hastelloy tube immediately sealed at both ends. Once the sealed Hastelloy® tube has cooled to room temperature, it is transferred to a $N_2$ glove bag where the tube is opened and the adsorbent added to a bottle containing alkane liquid that is to be purified. Although the ratio of adsorbent to liquid can be varied without limit, it has been found satisfactory to employ one volume of adsorbent for every 1 to 20 volumes of liquid. The actual amount of adsorbent required will depend upon the level of contamination in the as-received liquid. It is therefore well advised to employ some excess to insure maximum effectiveness in removal of contaminants.

A key aspect of any distillation process is that it be performed in the cleanest, least contaminated distillation apparatus possible. It is particularly desirable to exclude oxygen and any adventitious or systemic organic contaminants. It is found in the practice of the invention that employment of grease, including fluorinated greases, such as are commonly employed in distillation and vacuum systems to provide improved sealing and easier part removal can contaminate the distillate herein sufficiently to actually degrade the absorbance. It is therefore highly preferably to perform the distillation in a "grease-free" distillation system. "Grease-free", as used herein, means that no grease is employed when assembling the cleaned parts of the system. One of skill in the art will appreciate that the term "grease-free" does not mean that the invention is not operable should there be some small amount of grease contamination somewhere in the system. To the extent that the system can be cleaned of all grease contamination, the absorbance by the liquid alkane is advantageously reduced, but "grease-free" is not intended to require the complete absence of any grease in no matter how small a concentration.

There are manifold uses for the highly transparent liquid alkanes in the wavelength range of 170 to 260 nm. Contemplated applications include, but are not limited to, optical couplants, optical cements, optical elements such as liquid lenses, index-matching optical inspection media for semiconductor wafers and devices, and immersion fluids, especially for 193 and 248 nm photolithography.

Preferably, the liquid alkane has a refractive index in the range of 1.5 to 1.7, more preferably 1.6 to 1.7.

While in most instances it is generally practical to purchase highly purified, distilled grades of liquid alkanes so that treatment with an adsorbent such as silica gel is the only needed purification step, it may be desirable for some applications to employ an analytical method, such as gas chromatography/mass spectrometry, to identify contaminants in order to best develop a methodology for purification. Known methods for removal of contaminants can be used, but it is highly preferred methods are executed under clean conditions that avoid further contamination.

Sparging is a suitable method for removing contaminants from the alkanes, particularly for the removal of oxygen. One method for sparging that can be used is as follows: A glove box is supplied with dry, low-oxygen-content nitrogen such as 99.998% or better nitrogen sold as a cylinder gas by Matheson or by the boil-off of liquid nitrogen. A liquid aliquot of about 10 ml is placed in a 20 ml glass scintillation vial. The sample is transferred into the nitrogen purged dry box. The vial is secured flat on the work surface; the plastic cap is removed from the vial, a disposable glass pipette lowered into the solvent and then nitrogen delivered via the pipette from the same dry, low-oxygen source as the glove box. Flow rate is adjusted to maintain vigorous bubbling of solvent short of causing the solvent to splash out of the vial. Vigorous sparging is continued for 30-60 seconds, long enough to significantly decrease oxygen content and possibly water content without major loss of the liquid alkane to evaporation.

Because available instrumentation has a sensitivity limit of about 1 ppm of oxygen the actual oxygen concentration in a specimen may be considerably lower than 1 ppm. Henry's Law can be employed to estimate the oxygen concentration in cyclohexane, using the Henry's Law constant available in the literature. It is assumed in every case that the liquid alkane is in equilibrium with the headspace atmosphere, which consists, for the purpose of calculation, of nitrogen with the indicated partial pressure of oxygen.

TABLE 4

Calculated Dissolved Oxygen in Cyclohexane

| Partial Pressure O2 over Cyclohexane | Calculated O2 Dissolved in Cyclohexane |
|---|---|
| 0.38 Torr O2 (1 atmosphere of N2 over cyclohexane containing 500 ppm O2) | 0.22 ppmw |
| 0.038 torr O2 (1 atmosphere of N2 over cyclohexane that contains 50 ppm O2) | 0.02 ppmw |
| 0.0076 torr O2 (1 atmosphere of N2 over cyclohexane that contains 10 ppm O2) | 0.004 ppmw |
| 0.0038 torr O2 (1 atmosphere of N2 over cyclohexane that contains 5 ppm O2) | 0.002 ppmw |

TABLE 4-continued

Calculated Dissolved Oxygen in Cyclohexane

| Partial Pressure O2 over Cyclohexane | Calculated O2 Dissolved in Cyclohexane |
|---|---|
| 0.21 torr O2 (1 torr pump vacuum: i.e. 1 torr air over cyclohexane) | 0.12 ppmw |
| 1.05 torr O2 (5 torr pump vacuum: i.e. 5 mm air over cyclohexane) | 0.61 ppmw |

The nitrogen atmosphere in which the specimens were handled in the present examples was produced from boiled off liquid nitrogen and is estimated to have had an oxygen concentration of 3-5 ppm. As can be seen in Table 4, this corresponded to about 0.002 ppm oxygen in the cyclohexane. This concentration was well below the preferred upper limit for the present invention of 2 ppm oxygen.

An alternative method for purifying the liquid alkane is bulb-to-bulb distillation through a bed of 3 A molecular sieves. For example, two flasks are connected by a tube containing 3 A molecular sieves preheated as described above. One of the flasks is then partially filled with the liquid that is to be purified and the system resealed. The liquid is subjected to three freeze/thaw cycles to remove dissolved oxygen. The system is then thoroughly evacuated after refreezing the liquid with liquid nitrogen. The system is sealed under vacuum and the liquid nitrogen-cooling bath transferred from the flask containing the liquid to the empty flask. As the liquid warms towards room temperature it distills through the bed of 3A molecular sieves to the chilled flask. Once distillation is complete the vacuum is relieved with oxygen free nitrogen, the purified liquid allowed to warm to room temperature, and the flask then valved off for subsequent use.

From the standpoint of practical utility, it is highly desirable to remove contaminating species that exhibit photochemical reactivity. Such species not only tend to be strongly absorbing in the wavelength region from 170 to 260 nm, but also can undergo photo-induced reactions, often resulting in bubble formation and darkening of the liquid alkane. Extraction of any one photochemically active species is beneficial whether or not any other photochemically active species present is extracted.

In one embodiment of the present invention, the entirety of a surface may be illuminated by the emitted light. However, preferably the surface is imagewise exposed, leaving some portions exposed and others not. Preferably the surface is immersed in the liquid alkane.

In a preferred embodiment, the liquid alkane is employed in immersion photolithography in the wavelength range from 170 to 260 nm, preferably at 193 nm or 248 nm, most preferably at 193 nm. In this embodiment, at least the photoresist surface target is immersed in the liquid alkane A liquid suitable for use in immersion photolithography is preferably transparent enough to allow a working distance of at least 10's of micrometers and have radiation durability at 193 nm. The combination of transparency, refractive index, and radiation durability of the liquid alkane makes it particularly well suited for immersion photolithography at 193 nm exposure wavelength.

It is also highly preferred that the alkane be chemically and physically compatible with other materials used in the process. In immersion photolithography at 193 nm exposure wavelength, the immersion fluid is in contact with a photoresist polymer. It is highly desirable that the immersion fluid not dissolve or swell the photoresist, not interfere with latent image formation in the photoresist under 193 nm exposure, and not interfere with subsequent development of the photo-imaged photoresist in a developer solution. In addition the immersion fluid preferably has a low enough volatility that it does not require a pressure vessel for containment and is can be removed for reprocessing prior to post exposure baking and development.

When the immersion fluid damages the resist, a topcoat may be necessary. A suitable topcoat is preferably substantially transparent in the range of 170-260 nm wavelength, particularly at 193 and 248 nm, photochemically inert in that wavelength range, substantially insoluble in the liquid alkane, and soluble in solvents in which, the photoresist is insoluble. Thus, the substrate is spin-coated with a photoresist, the coated substrate is spin-coated with a topcoat, and the spin-coated substrate is contacted with the liquid alkane. Photo-imaging can then be carried out, the topcoat removed by dissolution in a solvent that does not dissolve or swell the photoresist, and the photoresist developed according to methods known to those skilled in the art In some processes, the liquid alkane is subject to repeated exposure to intense bursts of laser light, and is in contact with other surfaces that, however, clean, may still contain some contamination. Both these effects can be deleterious over time to the absorbance of the liquid alkane. It has been found that the liquid alkane can be restored to absorbance below 1 $cm^{-1}$ by recycling through adsorbents such as those recited hereinablve, preferably under inert gas. Recycling and regeneration of the liquid alkane can be accomplished batch-wise or continuously.

Figure 17:
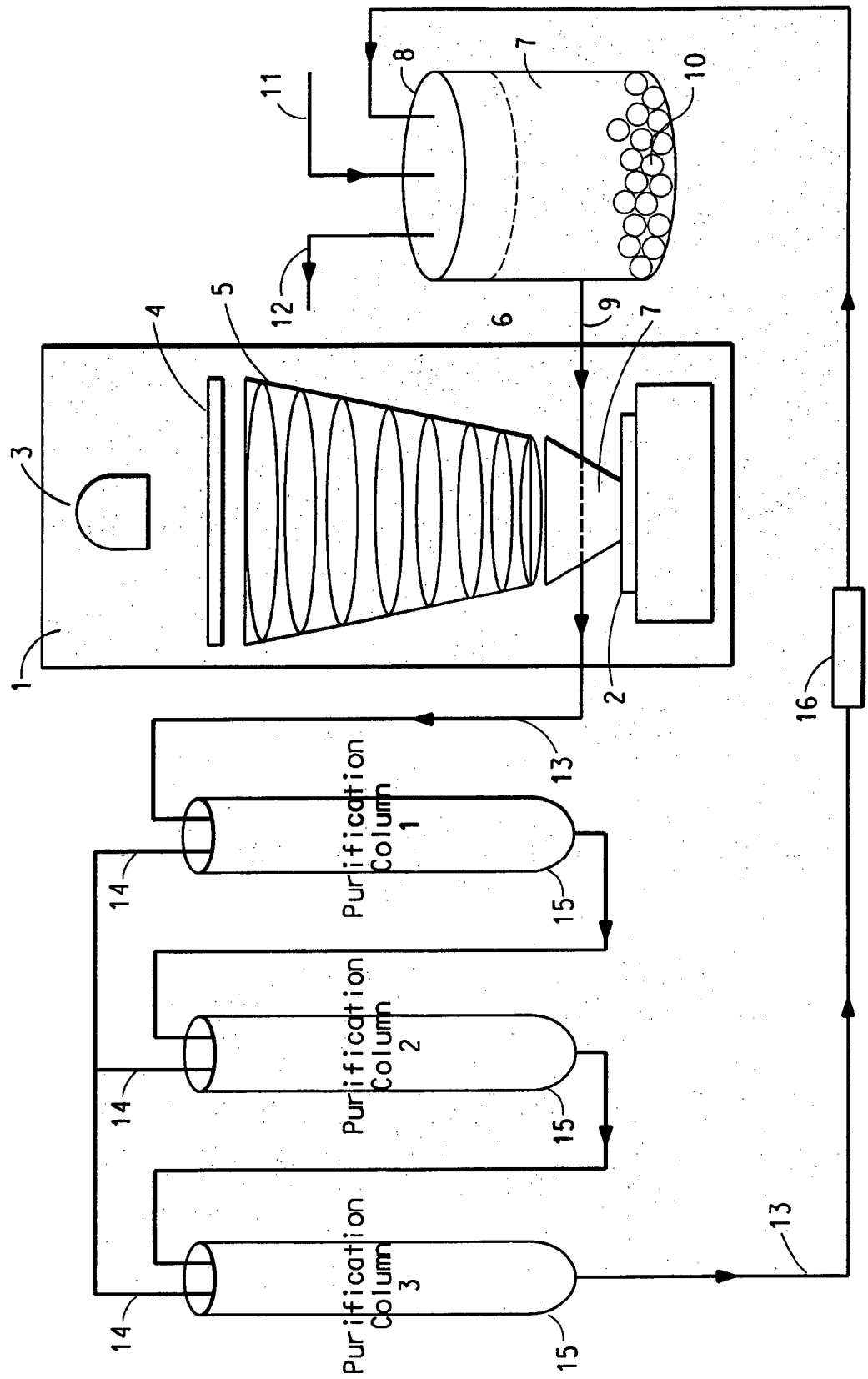
FIG. 17 shows one embodiment of a recycling system suitable for the practice of the present invention.

In a preferred embodiment, a process further comprises using a closed-loop recycling system for continuously retreating and re-introducing the liquid alkane. One embodiment of such a recycling system is shown in FIG. 17. Shown in FIG. 17 is an "optical stepper", also called an "optical scanner," 1, in which a photoresist disposed upon a silicon wafer, 2, is imaged. Light from a light source, e.g., 193 nm ArF Excimer Laser, which has been optically homogenized by the illuminator, 3, illuminates a photomask 4, and then the light goes through the projection lens 5 which typically has many individual lens element and reduces the image size by 4 or 5 times. At the bottom of the projection lens there is a "shower head," 6 which couples the last lens element of the projection lense, with the immersion fluid and the photoresist coated wafer, so that there are no interceding air gaps in the optical path of the light. The shower head is filled with the immersion fluid, for example the liquid alkane 7, and the immersion fluid contacts the last lens element of the projection lens and the photoresist coated silicon wafer 2 which will receive the photomask pattern. The photoresist coated silicon wafer may also contain a top coat layer, which is above the photoresist layer, and may be used to separate the immersion fluid from the photoresist. The "shower head" is so named because it serves as the supply and the return of the flowing immersion fluid in the optical stepper, and captures the immersion fluid from flowing into undesirable locations in the optical stepper. In this embodiment, the liquid alkane 7 is fed continuously to the shower head, 6, from a reservoir, 8, via a transfer line, 9, the reservoir containing adsorbent particles, 10, such as activated silica gel, alumina, carbon, zeolites, or most preferably, a mixture thereof. The reservoir is continuously purged with inert gas via an input feed, 11, and exhausted via an exhaust outlet, 12. In addition the reservoir may be actively sparged. The liquid alkane is fed continuously to the showerhead, and removed continuously therefrom via a recycle line, 13. The recycle line feeds the liquid alkane to a series of three inert gas, 14, purged columns, 15, packed with adsorbents and these columns may also be actively sparged. Upon exiting the last column, the recycle stream passes through an on-line UV spectrometer consisting of a light source and a detector, preferably which is measuring the absorbance at the lithographic wavelength, 16, to monitor the optical absorbance of the reprocessed immersion fluid. The recycle stream is then fed directly back into the reservoir, 9. The immersion fluid can be made to flow through the system, from the reservoir, through the shower head and through the purification columns by various means, for example by a pump such as a peristaltic pump (choosen to be made of non-contaminating materials) or alternately the immersion fluid can be made to flow under inert gas pressure, and with mass flow or fluid flow controllers.

Three preferred embodiments are contemplated within the framework of immersion photolithography at 193 and 248 nm exposure wavelengths. These are contact, proximity, and projection immersion photolithography. In projection immersion photolithography, the index of refraction of the liquid has the effect of providing an effective reduction in the wavelength of the incident laser light where $\lambda_{immersion\ fluid} = \lambda_{vacumn} / n_{immersion\ fluid}$ where $\lambda$ is the wavelength of the laser light in the immersion fluid or vacuum respectively and n is the index of refraction of the immersion fluid. The effective reduction of the exposure wavelength results in improved image resolution and smaller attainable features.

In contact and proximity immersion photolithography, for example at 193 and 248 nm exposure wavelengths, the wavelength of the incident laser light in the fluid is the same as for projection immersion photolithography, but the feature sizes imaged are dictated by the contact or proximity mask used. In contact or proximity immersion photolithography the primary purpose of the liquid alkane is to protect the imaged surface, as for example, from particulate or dust contamination from the environment. Additionally contact or proximity immersion photolithographies are useful screening methods for determining the usefulness of a candidate liquid for the more complex and expensive but more preferred projection method.

In one embodiment 193 nm radiation from, for example an ArF excimer laser, is transmitted through a photomask, typically comprising a chrome metal circuit diagram patterned on glass by electron beam imaging, forming an image of the circuit pattern on a photoresist. Numerous materials for use as photoresists are well known in the art and are in widespread commercial use. All such materials are suitable for the practice of the present invention so long as they are sensitive to 193 nm light and are substantially insoluble in the alkane or can be protected from dissolution by a topcoat. Suitable photoresist compositions are described in *Introduction to Microlithography*, Second Edition by L. F. Thompson, C. G. Willson, and M. J. Bowden, American Chemical Society, Washington, D.C., 1994. Examples of suitable photoresists include the 193 nm Epic Resists from Rohm and Haas Electronic Materials, (Marlborough, Mass.), or other resists from companies such as TOK (OHKA AMERICA, INC. Headquarters/Hillsboro, Oreg. or AZ Electronic Materials, Somerville, N.J.

Both positive-working photoresists, such as Rohm and Haas's Epic 2200 and negative-working photoresists such as Rohm and Haas's UVN30 are suitable for use in the immersion photolithography process. A positive-working photoresist is one wherein the regions exposed to light are rendered soluble in the developer while the unexposed regions are insoluble therein. A negative-working photoresist, is one wherein the regions exposed to light are rendered insoluble in the developer while the regions unexposed to light are soluble therein.

A photoresist, when imagewise exposed to light, forms what is called a latent image. In one embodiment of a process of the invention, a chemically amplified, positive resist containing a photoacid generator (PAG), is employed. The photoresist layer comprising the latent image is subject to a post exposure bake (PEB) step for typically 60 seconds at temperatures between 90 and 140 C in air. After this PEB step, the photoresist coated wafer is then put into an aqueous base developer, such as a 0.26 Normal TMAH developer, whereby the exposed regions of the polymer film are developed away, and the patterned photoresist is observed.

In characterizing the behavior of a photoresist used in a photolithographic process, two useful exposure parameters employed in the art are $E_0$, the open grid exposure dose required to clear the photoresist, and $E_1$, the minimum dose required to produce the desired image. $E_0$ is sometimes called the clearing dose, and $E_1$, the sizing dose, for achieving features of the correct size.

While there is no particular limitation on the thickness of the photoresist layer, in the typical practice of the present invention the photoresist coating will be 150 nm to 200 nm in thickness on a silicon wafer substrate. This thickness is determined by the desired minimum feature sizes to be printed. For the purpose of illustration of this concept, but in no way limiting on the scope of application the invention, using an aspect ratio of 3-4, a typical value in the semiconductor art, if the desired features are 65 nm in width, the film thickness should be ~195 nm. In general, the thicker the photoresist layer, the better resistance to dry etch processes in subsequent processing of the patterned photoresist layer.

The presence of a topcoat does not materially alter the operability of the immersion photolithography. Suitable topcoats include, but are not limited to, highly transparent fluoropolymers, which are soluble in fluorinated solvents, which fluorinated solvents in turn are not solvents for the photoresist polymers. Particularly preferred are amorphous perfluoropolymers such as Teflon® AF, available from DuPont. In a typical application, an amorphous fluoropolymer is dissolved to a concentration of 1-5% by weight in a perfluorinated solvent such as Fluorinert™ FC-75. The solution so formed is spin-coated onto a photoresist coated substrate to form a topcoat film of 50-300 nm thickness.

One of skill in the art will appreciate that the source of the 193 nm radiation, or radiation in the wavelength range of 170-260 nm, is not critical. ArF excimer lasers are convenient, controllable, high intensity sources of 193 nm radiation and are therefore preferred.

Figure 4:
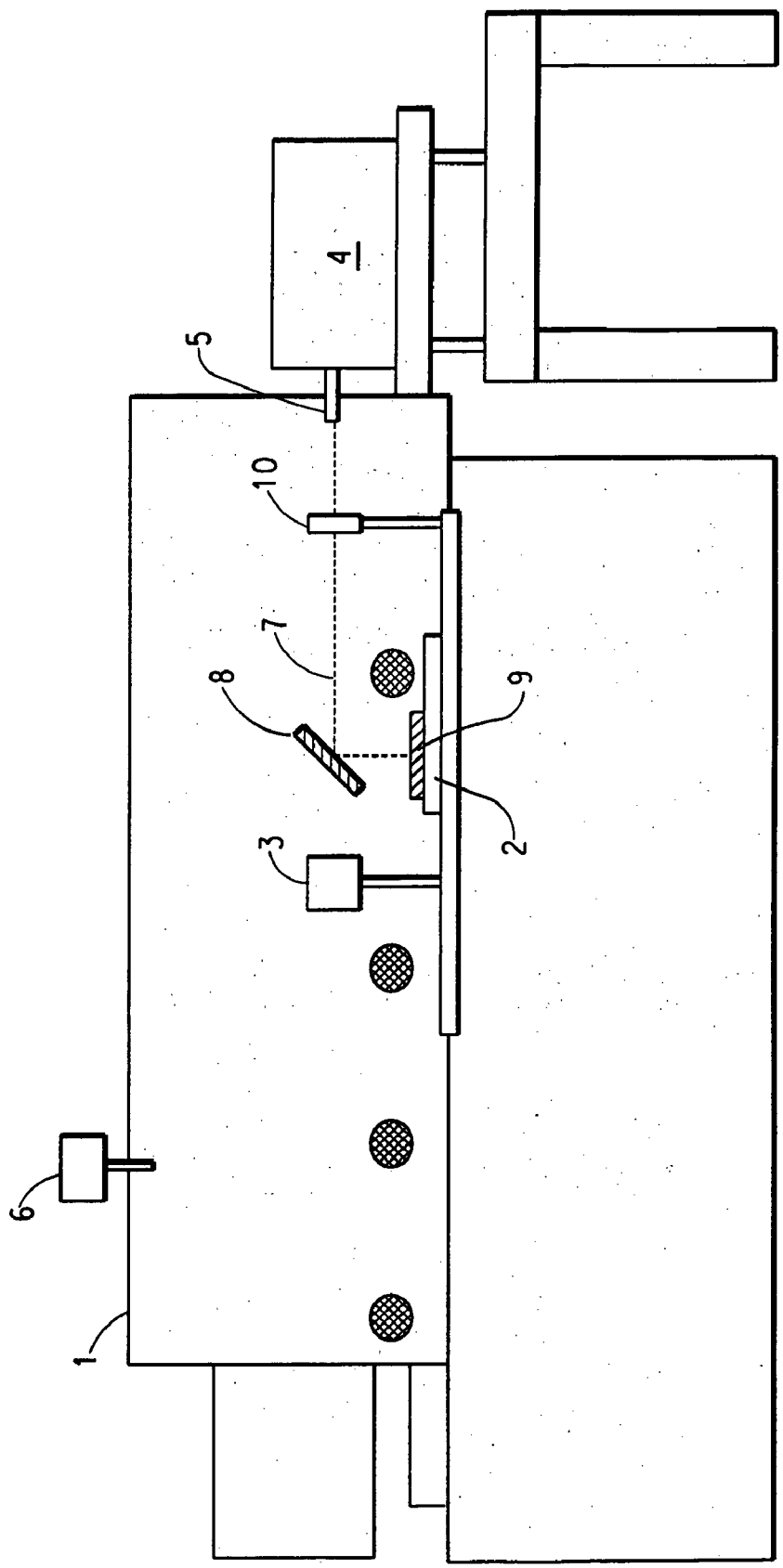
FIG. 4 describes the equipment for immersion contact lithography.
Figure 5:
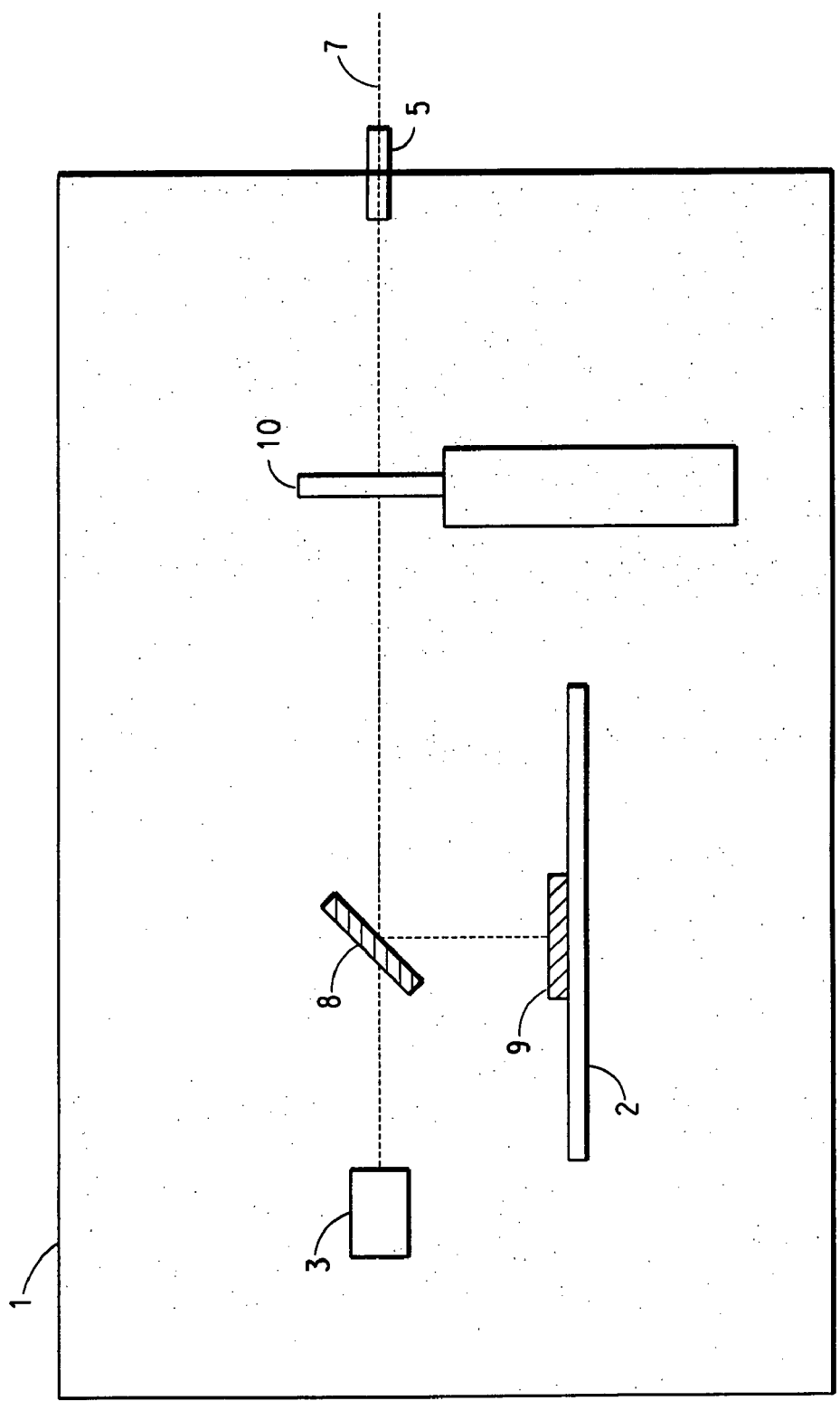
FIG. 5 describes the optical apparatus for immersion contact lithography.

One embodiment of a photolithographic process according to the invention is depicted in FIGS. 4, 5, and 6. FIG. 4 shows a complete system, parts of which are advantageously disposed in a nitrogen dry box, 1, with an optical table, 2, mounted inside the dry box to accommodate optical components and a translating sample stage. A Scientech power meter, 3, is used to read the energy of the 193 nm laser light pulses emitted by an ArF excimer laser, 4. In the particular embodiment depicted in FIG. 4, the photolithographic exposure chamber is a low oxygen/low moisture nitrogen flushed dry-box (Nexus Dry Box, Vacuum Atmospheres Co., Hawthorne Calif. 90250-6896) adapted for use in the apparatus therein depicted. The 193 and 248 nm laser light is introduced into the dry box through an access port 5. A dry box control panel mounted internal oxygen and moisture analyzer, 6, is used to monitor the oxygen content in the dry box, and to indicate when oxygen concentration has decreased to acceptable levels after introduction of samples. Upon introduction into the dry box chamber, the laser beam 7 is reflected downwards by a fused silica beam splitter, 8, to the photoresist coated silicon wafer, 9. The photoresist coated wafer is contained in a machined aluminum wafer holder and immersed to a depth of about 1 mm in the liquid alkane. The whole plate can be translated under the laser beam to allow sequential exposures of different portions of the wafer, with differing exposure doses.

FIG. 5 shows more details of the optical exposure system of FIG. 4. The pulsed laser beam, 7, from the Excimer laser 4 enters the dry box, 1, at the access port, 5, goes through a manually operated shutter, 10, and is then incident on a fused silica beam splitter 8, that reflects a small portion of the laser energy down towards the photoresist coated silicon wafer 9 mounted on a translator that allows the sample to be translated under the laser beam. The majority of the laser beam continues through the beam splitter 8 and is then incident on a power meter head, 3.

Figure 6A:
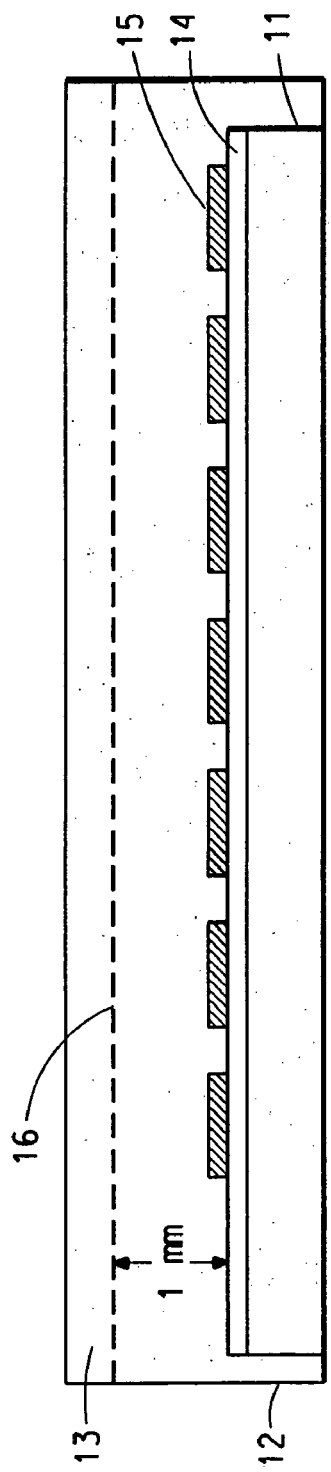
FIG. 6 shows the wafer exposure stage for immersion contact lithography.
Figure 6B:
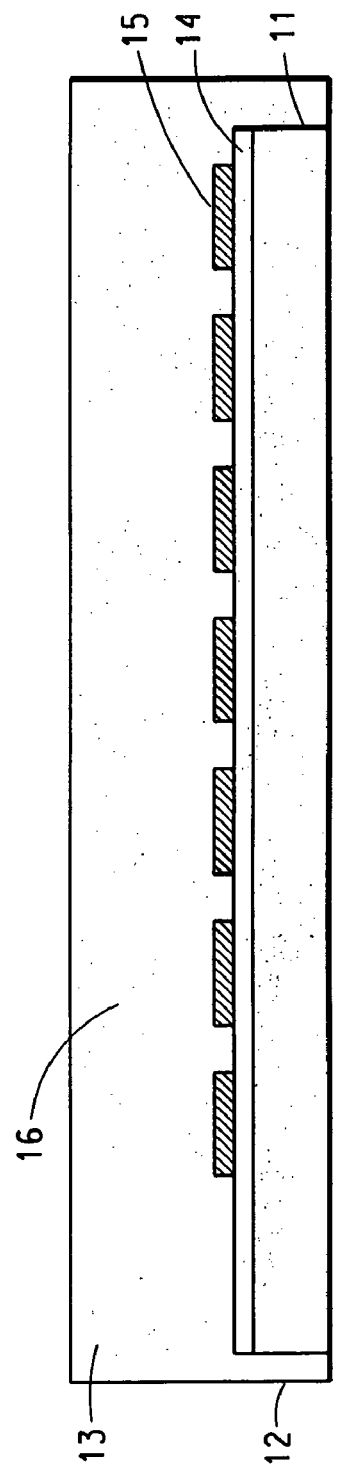
Figure 7:
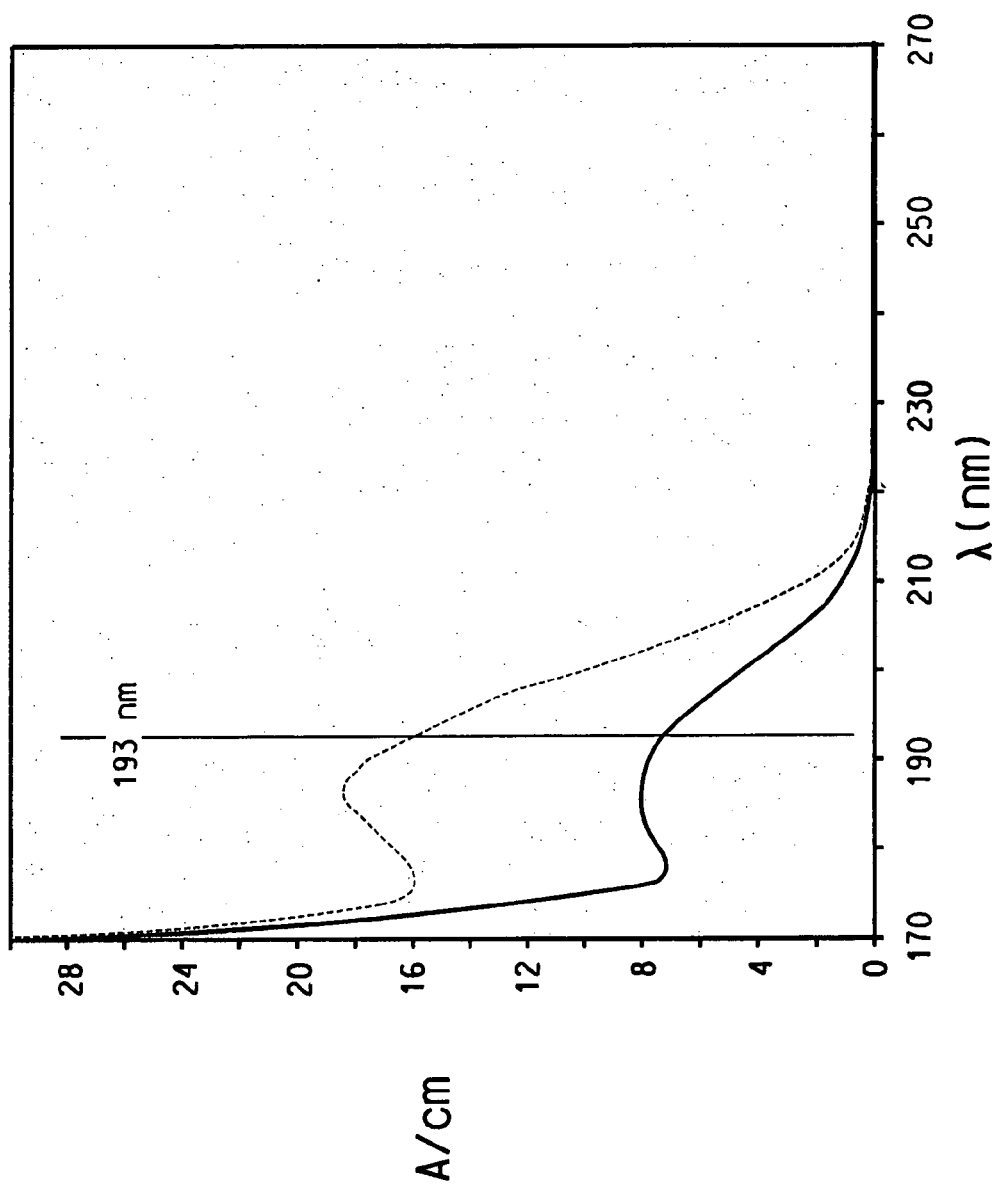
FIG. 7 shows the absorbance in units of inverse centimeters for decane versus wavelength lambda (l) in units of nanometers for a sample a) as received, and b) treated with silica gel.
Figure 8:
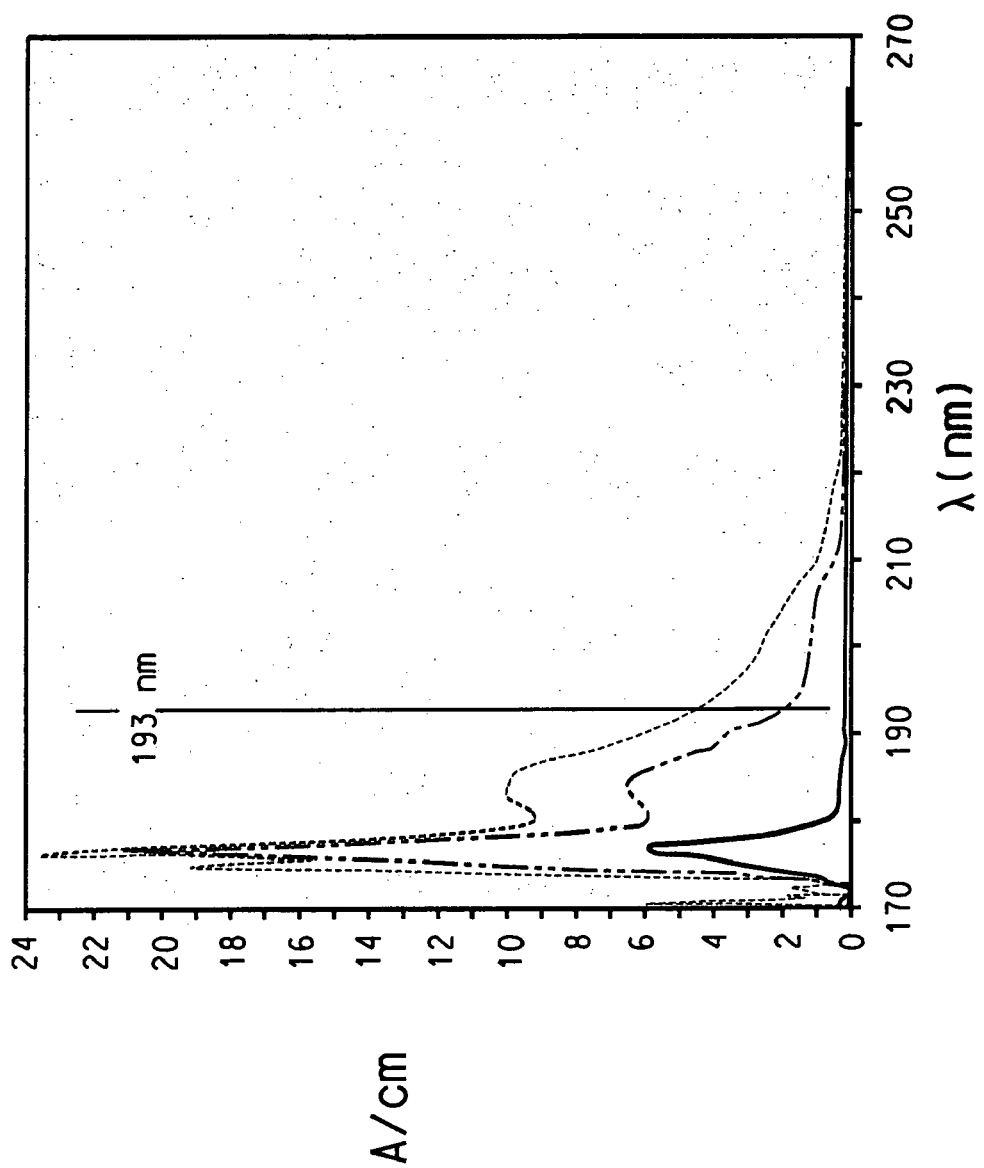
FIG. 8 shows the absorbance in units of inverse centimeters for cyclohexane versus wavelength lambda in units of nanometers for a sample. a) as received, b) treated with 3A molecular sieves (dashed and dotted line), c) treated with silica gel.

FIG. 6 shows the wafer exposure stage, where the laser light, from the excimer laser hits the silicon wafer 11, in the machined aluminum plate 12 that moves under the laser beam along the translation stage on the optical table 2 of FIG. 4, so as to permit the sequential exposures, at various exposure doses. 13 is the N2 environment of the N2 dry box. 11 is the silicon wafer, which has been coated with a photosensitive photoresist polymer 14 as discussed in more detail below. Not shown is the topcoat layer as hereinabove discussed. Depicted in FIG. 6A is an embodiment of contact immersion photolithography at 193 nm exposure wavelength wherein a photomask 15 is placed on the surface of the photoresist polymer layer and the immersion fluid is introduced to cover the photoresist coated silicon wafer to a depth of approximately 1 mm 16. It has been found that when the photomask is small and light, as for example the metal grids used in the specific embodiments herein, it is convenient to introduce the immersion fluid first and then to position the photomasks in the fluid and on the surface of the photoresist coated silicon wafer. FIG. 6B depicts the same set-up but without the immersion fluid; FIG. 6B is not an embodiment of the present invention.

In another embodiment of the present invention, the photomask can be offset from the surface of the photoresist by a distance of about 10 μm. In a preferred embodiment of the present invention, in so called projection photolithography at 193 nm exposure wavelength, the photomask is disposed at some convenient location in the optical path, and the image is projected via a lens system, typically known as a projection lens, onto the photoresist. The projection system provides the highest resolution of the various embodiments of the present invention.

In another preferred embodiment of the process of the invention, projection photolithography at 193 nm exposure wavelength is employed. In this embodiment the output element of the projection lens—that end of the lens system closest to the photoresist surface—is disposed within the liquid alkane at a distance of about 0.5-5 mm from the photoresist surface, which is also immersed in the liquid alkane, the photoresist surface optionally having a topcoat 50-200 nm thick. In this embodiment the effective wavelength of the incident light is decreased, thereby increasing image resolution over that which can be attained in a gaseous atmosphere.

Thickness of the liquid alkane layer is determined by the details of the imaging system being developed or used. For example, in contact photolithography at 193 nm exposure wavelength a suitable thickness of the liquid alkane immersion layer is 1 mm. A 1 mm thickness may also be suitable for scanning or stepping the wafer under a projection lens, while maintaining sufficient distance between the output element of the projection lens and the wafer. One of skill in the art will appreciate that as the immersion fluid thickness is increased attenuation of the light will also increase, but tolerances in regard to the mechanics of stepping and scanning may become easier. Thinner immersion liquid layers may permit higher light exposure levels but the tolerances required for achieving scanning and/or stepping the wafer at high speed and with high accuracy may become excessively demanding.

The liquid alkane presents a highly desirable combination of properties. It is preferably an easily handled, low viscosity liquid. It exhibits desirably low absorbance at 193 nm, in the preferred embodiment, an absorbance of 0.1-2 cm$^{-1}$. In a highy preferred embodiment, the absorbance of the alkane at 193 nm is less than 0.5 cm$^{-1}$ and its refractive index is from about 1.4 to about 1.7.

The liquid alkane provides flexibility in system design, reducing the need to trade-off between the thickness of the immersion layer and mechanical design.

In a complete semiconductor manufacturing process, the photolithographic imaging and development of a photoresist layer, is performed many times in sequence, with a series of photomask patterns, and with various etch and deposition processes done between the sequential photolithographic steps.

The liquid alkane can be employed in any number of ways in addition to as an immersion liquid in photolithography. Examples of other applications include those in which the alkane is disposed between a 193 or 248 nm light source and a target. The alkane can employed neat, as in liquid lenses, index matching fluid, and the like, or it can be an ingredient of a mixture or a diluent such as a solvent for polymers in spin-coating operations, a plasticizer in a polymeric film, or a solvent in an adhesive formulation. In another embodiment, the alkane can be used in optical inspection of patterned or unpatterned objects such as semiconductor wafers, where small size defects of varying optical properties are to be detected. The use of the alkanes as immersion fluids for immersion inspection enables both higher resolution imaging in the inspection, and also reduces optical scattering from the topography of the sample, permitting the inspection of, for example, deep holes that may have defects, such as particulate debris present. In still further embodiments, the liquid alkane is useful in the fabrication of sheets, layers, coatings, and films used in lenses, light guides, anti-reflective coatings and layers, windows, protective coatings, and glues suitable for use in 193 nm photolithography.

The liquid alkane can also be used in elements in a compound lens designed to reduce chromatic aberrations. Heretofore, only CaF2 and possibly hydroxyl free silica have been viewed as having sufficient transparency at 193 nm to be used in transmissive focusing elements. It is also known, as disclosed in, for example, R. Kingslake, Academic Press, Inc., 1978, Lens Design Fundamentals, p. 77, that by using a second material of different refractive index and dispersion, an achromatic lens can be created. By using the liquid alkane in conjunction with CaF$_2$, it is expected that an achromatic lens can be constructed from this and other similar materials described in this application.

The present invention is further described but not limited to the following specific embodiments.

EXAMPLES

Optical Absorbance Measurements

The transmission based absorbance measurements were made using a Harrick Scientific Corp. (Harrick Scientific Corporation 88 Broadway Ossining, N.Y.) Demountable Liquid Cell model DLC-M13 shown in FIG. 1. The cell had a 8 mm aperture, which included (2) 13 mm diameter×2 mm thick $CaF_2$ windows, Viton® o-ring seals, (2) Luer-Lok(R) fittings for loading sample, assorted Teflon(r) spacer thicknesses from 6 um to 4000 um. The DLC-M13 was mounted in a variable angle spectroscopic ellipsometer manufactured by J. A. Woollam Co., Inc., Lincoln, Nebr., either a VUV-Vase® model VU-302 for measurements from the near IR to 145 nm, or a DUV-Vase® model V- for measurements from the near IR to 187 nm. As indicated in FIG. 1, the liquid specimen to be tested was held in a cell formed between parallel CaF2 windows by insertion of a Teflon(r)® ring between the windows. Teflon(r)® rings of 6, 25, 100, 500, 920, 2200, 3000, 4000, 6000, and 10000 micrometer thicknesses were used, providing multiple optical path lengths through different aliquots of the same sample. While charging the cell, care was taken to avoid bubbles in the 8 mm diameter window aperture.

The optical absorbance, A ($cm^{-1}$), per centimeter of specimen thickness as defined in Equation 1, is defined for purposes herein as the base 10 logarithm of the ratio of the transmission of the $CaF_2$ windows at the test wavelength divided by the transmission at that wavelength of the test sample (windows plus experimental specimen) divided by the thickness (t) of the test specimen—in the case of the experiments reported herein, either 6, 25, 100, 500, 920, 2200, 3000 or 4000 micrometers, as discussed hereinabove.

$$A\ (cm^{-1}) = \frac{Log_{10}|T_{substrate}/T_{sample}|}{t}.\qquad\text{Equation 1}$$

To eliminate the effect of multiple reflections in the case of the liquid samples employed herein, absorbance was determined using the relative change in the transmission of multiple liquid filled Harrick cells with differing cell spacer thicknesses. For example for two different cell thicknesses, the spectral transmission was measured at both cell thicknesses ($t_1$ and $t_2$) and the incremental decrease in transmission ($T_1$ and $T_2$) with the increase in the sample's optical path length provides the optical absorbance/centimeter using Equation 2.

$$A/cm = \frac{\log_{10}(T_1) - \log_{10}(T_2)}{t_2 - t_1}.\qquad\text{Equation 2}$$

We generalized this relative transmission method for absorbance determination from multiple optical path lengths in the sample so as to achieve better accuracy in determining the optical absorbance per centimeter of these materials. We used up to 5 different optical path lengths, spanning from 6 to 4400 micrometer cell thicknesses. In this case we measured the transmission $T_n$ (in general) as a function of thickness $t_n$ for the cells of various thicknesses.

$$T_1(\lambda) = T_0(\lambda) e^{-\alpha(\lambda)t_1}$$

$$T_2(\lambda) = T_0(\lambda) e^{-\alpha(\lambda)t_2}$$

$$T_3(\lambda) = T_0(\lambda) e^{-\alpha(\lambda)t_3}$$

$$\ldots$$

$$T_n(\lambda) = T_0(\lambda) e^{-\alpha(\lambda)t_n}$$

Then taking logarithm of all equations gives $$\ln T_1(\lambda) = \ln T_0(\lambda) - \alpha(\lambda) t_1$$

$$\ln T_2(\lambda) = \ln T_0(\lambda) - \alpha(\lambda) t_2$$

$$\ln T_3(\lambda) = \ln T_0(\lambda) - \alpha(\lambda) t_3$$

$$\ldots$$

$$\ln T_n(\lambda) = \ln T_0(\lambda) - \alpha(\lambda) t_n$$

This is a set of N equations for the linear system $y_i = ax_i + b$, where $y_i \equiv \ln T_i(\lambda)$, $a \equiv -\alpha(\lambda)$, $b \equiv \ln T_0(\lambda)$, and $x_i \equiv t_i$.

We used linear algebra to simultaneously solve this system of linear equations by a least squares method for the absorbance/centimeter of the samples. The solutions were done both for the case where the errors of measurement for all observations were independent of i, (homoscedastic), the equations were solved by a least-squares method and for the case where the errors of measurement were dependent on i, (heteroscedastic), the equations were solved by a weighted least-squares method.

As an example for the homoscedastic case the equations we solved are:

$$\frac{\partial}{\partial a} \sum (\ln T_i(\lambda) + \alpha(\lambda)t_i - b(\lambda))^2 = 0$$

$$\frac{\partial}{\partial b} \sum (\ln T_i(\lambda) + \alpha(\lambda)t_i - b(\lambda))^2 = 0$$

And the solutions are:

$$\alpha(\lambda) = \frac{\sum t_i \sum \ln T_i(\lambda) - N \sum t_i \ln T_i(\lambda)}{N \sum t_i^2 - \sum t_i \sum t_i}$$

$$b(\lambda) = \frac{\sum \ln T_i(\lambda) \sum t_i^2 - \sum t_i \ln T_i(\lambda) \sum t_i}{N \sum t_i^2 - \sum t_i \sum t_i}$$

From this analysis of multiple transmission measurements of the material at multiple cell thicknesses we were able to determine the absorbance/centimeter of the material.

Harrick Cell Cleaning and Assembly Procedure:

Prior to use, and after each sample run, the Harrick cell was flushed with Vertrel® XF as a cleaning solvent (Miller-Stephenson Chemical Co., Danbury, Conn.). A clean 1 ml Glass syringe (Becton Dickinson, Franklin Lakes N.J.) with a female Luer-Lock fitting was filled with Vertrel XF and then attached to the male Luer-Lock fitting on the Harrick cell, at which point the Vertrel XF was flushed through the cell. The cell was then blown dry using "house nitrogen" (produced from the boil off of liquid nitrogen and which has fewer than 3 ppm of water and 5 ppm of oxygen). The cell was then disassembled in reverse order as shown in FIG. 1. The CaF2 windows and the selected thickness Teflon® spacers were placed into a 20 ml vial containing Vertrel® XF, the vials were capped and then put into an ultrasonic bath for, 30-60 seconds. The $CaF_2$ windows and spacers were removed form the cleaning vial, given a final rub with a Q-tip moistened with Vertrel® XF then dried with air from a puffer bulb. The cell was then assembled vertically stacking the components as shown in FIG. 1 in the order shown and hand tightening the compression nut onto the cell The cleaning and assembly was done in air, in the lab hood.

Loading the Harrick Cell in Air . . . (Lab Hood)

To the thus prepared cell, approximately 0.5 ml of the sample liquid was transferred from its container using a clean 1 ml BD glass syringe, the syringe was then attached into the cell and the cell was filled until the liquid meniscus was visible above the top Luer-Lok® fitting, so that no trapped bubbles were permitted to reside in the cell aperture. Then the top Luer-Lok® fitting on the Harrick cell was capped with the Teflon® plug, and the cell was inverted with the syringe still attached. The syringe was twisted off and the thus exposed cell fitting was capped with another Teflon® plug.

Loading the Harrick Cell in Nitrogen . . . (Nitrogen Dry Box)

A cell cleaned and assembled as in the previous section was placed into either the N2 purged antechamber of a Series 100 Plexiglass Glove Box (Terra Unversal, Anaheim Calif.) or a previously nitrogen-flushed mini chamber attached to a nitrogen purged Nexus model 100043 Dry Box (Vacuum Atmospheres Co., Hawthorne, Calif.). The antechamber was continually purged with house nitrogen until the oxygen meter on the dry box read 10 ppm $O_2$—approximately 30 minutes. The mini chamber was evacuated then filled with nitrogen three times prior to transfer of the equipment to the dry box.

The manner of specimen introduction into the Harrick Cell was as described in the previous section.

Loading a Dried Sample into the Harrick Cell in Nitrogen . . . (Nitrogen Dry Box)

A cleaned, assembled cell, with Teflon® plugs (separate; not inserted), a clean 1 ml BD syringe and the selected sample that had been dried over adsorbents still in the sample bottle, were placed in the dry box described above in the manner described.

The sample bottle was opened and the liquid poured into a clean 15 ml BD syringe with a 0.45 micrometer PTFE Luer-Lok® filter. Using the syringe, the liquid was transferred through the filter into a clean, dry 20 ml vial. Approximately 0.5 ml of the thus filtered sample was transferred into the cell as described above.

Absorbance Determination

For the purpose of the examples herein below, the absorbance of a material was determined using the relative transmission methods described above, for various cell thicknesses. The thickness of the test specimen was adjusted so that absorbance of at least 0.1% was achieved in order to keep measurement error the same across multiple specimens.

Absorbance was also measured directly using a Varian Cary 5 UV/Vis/NIR spectrometer. While single measurements in the Varian Cary 5 were not as accurate as relative transmission measurements using multiple path length measurements in a VUV-Vase ellipsometer, data acquisition was much less time-consuming.

Index of Refraction Measurements

Figure 2:
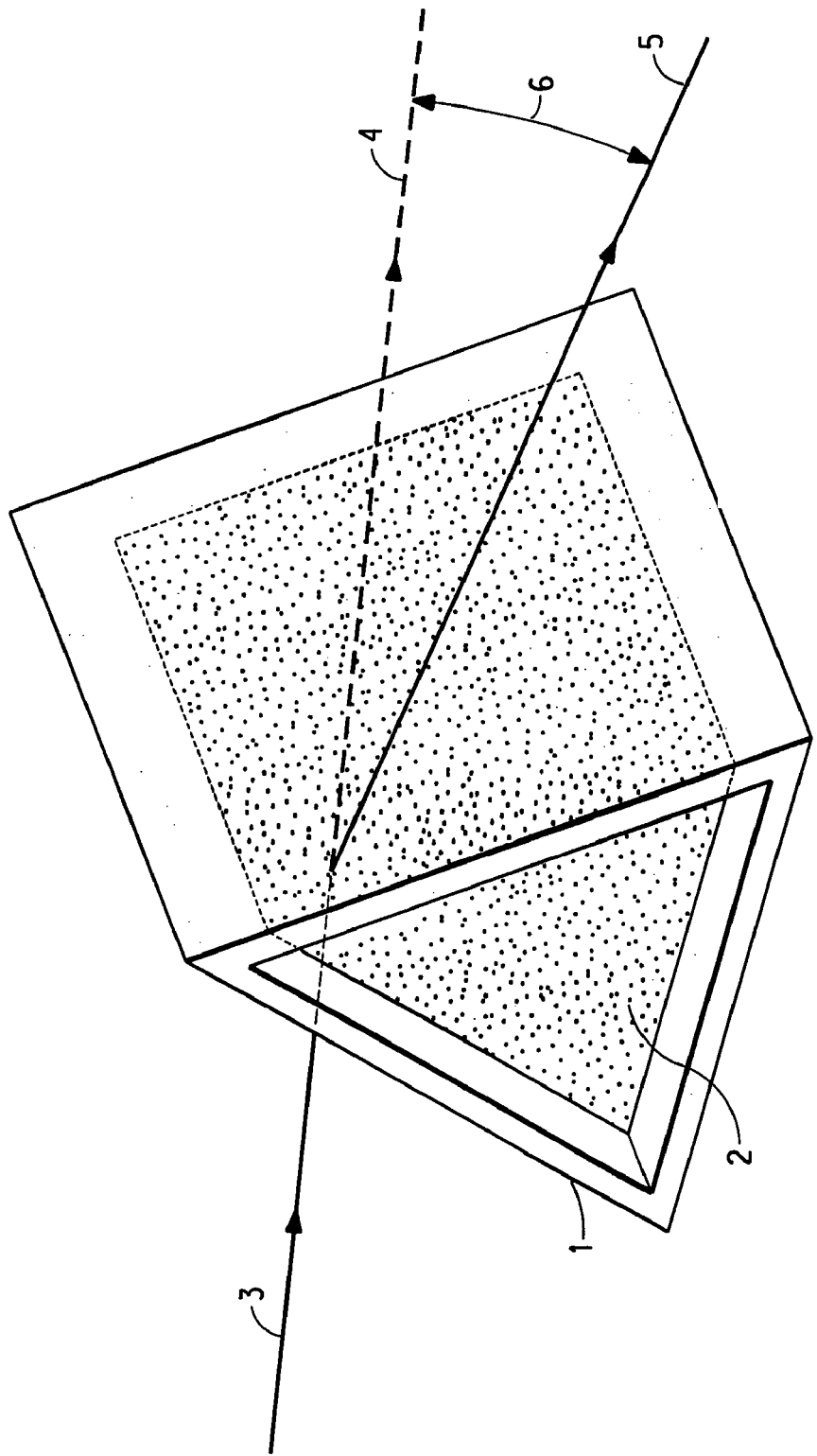
FIG. 2 shows the principles of the minimum deviation method for determination of the index of refraction of a liquid using a prism cell.
Figure 3:
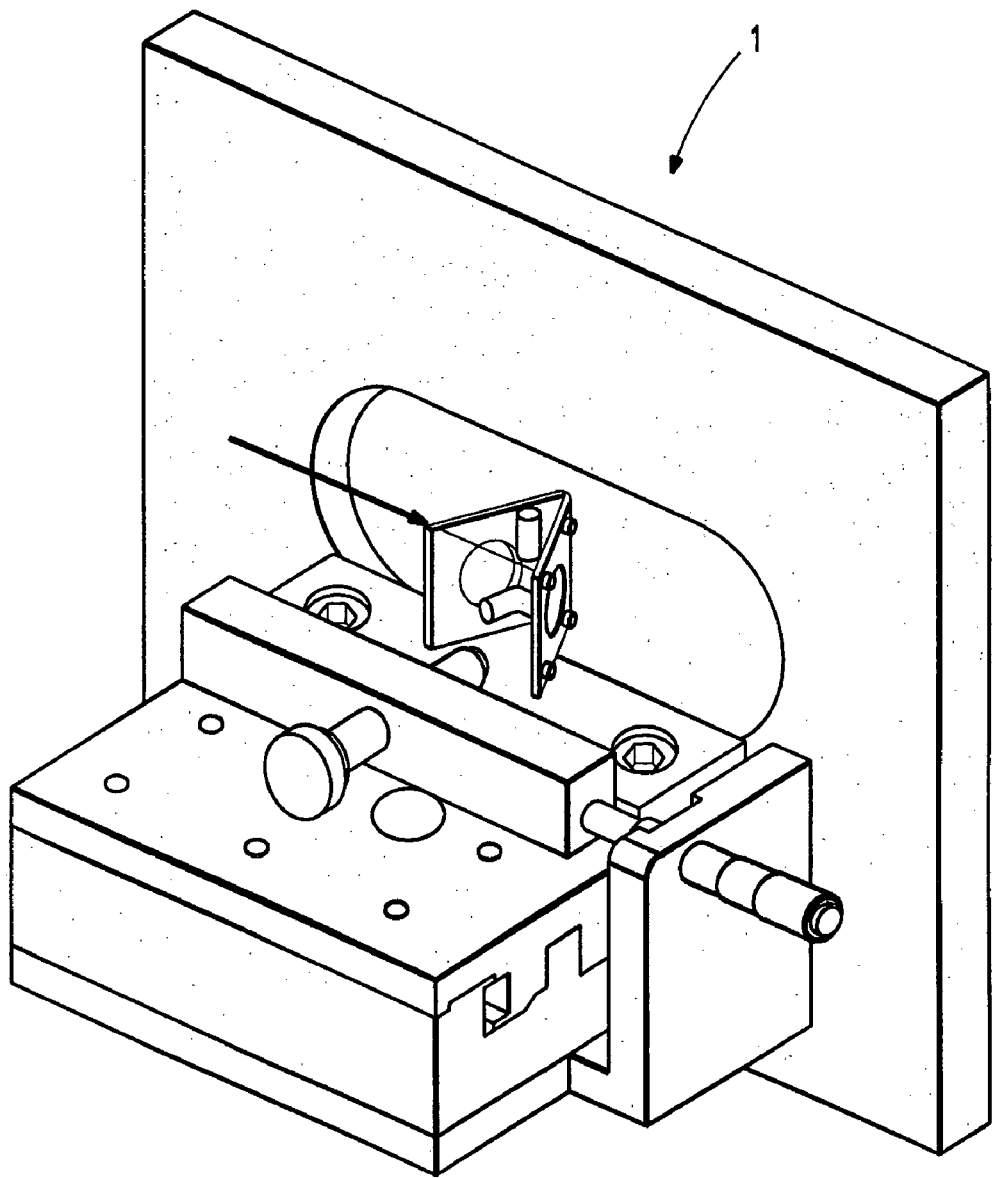
FIG. 3 shows the index cell, mounted on the holder used in the VASE® spectrophotometer.

The index of refraction of the material and its temperature coefficient was determined using the minimum deviation prism method illustrated in FIGS. 2 and 3 implemented for use on the VUV-vase and the DUV-vase instrument (see for example Burnett et al., "Absolute refractive indices and thermal coefficients of $CaF_2$, $SrF_2$, $BaF_2$, and LiF near 157 nm", Appl. Opt. 41, 2508-2513 (2002) and French et al., "Immersion Fluid Refractive Indices Using Prism Minimum Deviation Techniques", Optical Microlithography XVII, SPIE 5377-173, (2004).).

For the purpose of measuring the refractive index of fluids as candidates for Immersion Fluids to be used in microlithographic processing, a liquid-filled prism cell was used. The cell was a 60° equilateral, stainless steel, liquid prism, which included two 12.7 mm diameter×2 mm thick $CaF_2$ windows with Viton® o-ring seals, Luer-Lok® fittings for loading samples. The cell was disassembled for cleaning.

Prior to each use the cell was flushed with Vertrel® XF, through both Luer-Lok® fittings using a 1 ml BD glass syringe to flush out the previous specimen. Then the prism cell was dried with air from an air puffer bulb. The cell was then disassembled for cleaning. The CaF2 windows and the stainless steel cell body were cleaned by ultrasonic agitation in closed vials containing Vertrel® XF for 30-60 seconds The $CaF_2$ windows were rubbed with a cotton swab wet with Vertrel® XF after removal from the ultrasonic bath, then dried with air from a puffer bulb. The cell body was removed from the cleaning bottle then dried with air from a puffer bulb The cell was then reassembled.

Loading the Prism Cell in Nitrogen . . . (Nitrogen Dry Box)

A cleaned, assembled cell, with Teflon® plugs (separate, not inserted), a clean 1 ml BD syringe and the selected sample material were placed into either the Series 100 Plexiglass Glove Box or the Nexus model 100043 Dry Box as described herein above.

The sample bottle was then opened and approximately 1 ml of the sample was transferred from it, (this fluid had been filtered through a 0.20 micron PTFE filter), following the method previously described herein above.

Loading a Silica Gel or 3A Dried Sample into the Prism Cell in Nitrogen . . . (Nitrogen Dry Box)

A cleaned, assembled cell, with Teflon® plugs (separate, not inserted), a clean 1 ml BD syringe and the selected sample that had been dried over silica gel or 3A molecular sieves, still in the sample bottle, were placed in the dry box described above in the manner described.

The sample bottle was opened and the liquid poured into a clean 15 ml BD syringe with a 0.2 micrometer PTFE Luer-Lok® filter. Using the syringe, the liquid was transferred through the filter into a clean, dry 20 ml vial. Approximately 1 ml of the thus filtered sample was transferred into the cell as described above.

Minimum Deviation Index Method

The equilateral liquid prism was mounted on the VASE® which was equipped with a computer controlled, stepper motor driven $\Theta$-$2\Theta$ angle-of-incidence stage. The prism was mounted on the sample stage as shown in FIG. 3. The sample rotation stage and the detector arm rotation stage were controlled separately during the measurement. The target wavelength $\lambda$ was selected from the VUV to the near infrared (NIR) using a monochromator. For a given wavelength and incident angle, the detector arm was swept through a range of angles including the expected transmission angle in order to accurately determine the transmission angle. This process was repeated for a range of incident angles, which included the expected minimum deviation angle. Once the minimum deviation angle was determined, the index $n_{mat}(\Theta)$ was determined from Equation 3, where $\alpha$=prism apex angle, $\delta(\lambda)$=measured minimum deviation angle, and $n_{gas}(\lambda)$=index of the $N_2$ ambient, where $n_{nitrogen}$=1.0003 approximately.

$$n_{fluid}(\lambda) = \frac{\sin\left[\frac{\alpha + \delta(\lambda)}{2}\right]}{\sin\left(\frac{\alpha}{2}\right)} n_{gas}(\lambda). \quad \text{Equation 3}$$

The VUV-VASE ellipsometer was used for index measurements at a nominal temperature of 32° C. The DUV-VASE ellipsometer was used for index measurements at a nominal temperature of 22° C.

| Teflon ™ AF 1601, | co-tetrafluoroethylene/4,5-difluoro-2,2-bis(trifluoromethyl)-1,3-dioxole. | DuPont, Wilmington, DE. |
|---|---|---|
| | 76:24 co 4,5-difluoro-2,2-bis(trifluoromethyl)-1,3-dioxole/perfluoropropylvinylether), | methods taught in WO 01/37043 |
| | 60:40 co hexafluoropropylene/:tetrafluoroethylene | methods taught in U.S. Pat. No. 5,478,905. |
| Cytop ™: Perfluoropolymers | perfluorobutenyl vinyl ether co polymers | Asahi Glass, Chadds Ford, PA. |
| FLUORINERT ™ FC-75, | perfluoroether liquid | 3M, Minneapolis, MN |
| FLUORINERT ™ FC-40, | perfluoroamine liquid | 3M, Minneapolis, MN |
| Performance Fluid PF-5080, | perfluoroalkane liquid | 3M, Minneapolis, MN |
| Vertrel ™ XF | 2,3-dihydroperfluoropentane | DuPont |

Equipment Used

The work described herein below was performed in glove bags, glove boxes and dry boxes. The glove bag was a polyolefin bag with glove shaped appendages provided for manipulation and a crude seal at the bottom made by folding. The glove box was a homemade box fabricated by glueing-together sheets of PMMA boxes, and fitting out the box with regular dry box gloves. The dry box was a commercial box with high quality seals and ports, Applying Henry's law for oxygen concentrations as high as 100 ppm in nitrogen still results in only parts per billion dissolved oxygen. We have seen no experimental evidence that the specific enclosure employed made a difference in results and consequently, the several terms are referred to herein somewhat interchangeably.

Comparative Example 1

The index of refraction of deionized water, with a conductivity of 17.5 megohm's, was measured using the minimum deviation method discussed above. The index of refraction, at 32° C. was 1.433 at 193 nm and 1.377 at 248 nm. The index of refraction, at 22° C. was 1.436 at 193 nm and 1.378 at 248 nm.

Example 1

A. The absorbance of as received cyclohexane (Fluka catalog # 28935, purity ⌊ 99.5% by GC, b.p. 80-81° C.). According to the relative transmission method hereinabove, was found to be 4.78 cm$^{-1}$ at 193 nm.

B. Molecular sieves (3A) were dried for two hours under air at 350° C. About 10 grams of the so dried sieves were mixed with 20 ml of the as-received cyclohexane. After filtering the sieves off under N2 in a glove box, the absorbance of the thus treated cyclohexane was found to be 2.14 cm$^{-1}$ by the relative transmission method at 193 nm.

C. Silica gel (Aldrich catalog number 24,982-3, type 3, 8 mesh) was dried at 500° C. for two hours under air. About 10 ml of the so dried silica gel was added to 20 ml of the as received cyclohexane. After filtering the silica gel off under N2 in a glove box, the absorbance of the thus treated cyclohexane was found to be 0.14 cm$^{-1}$ by the relative transmission method at 193 nm.

Figure 9:
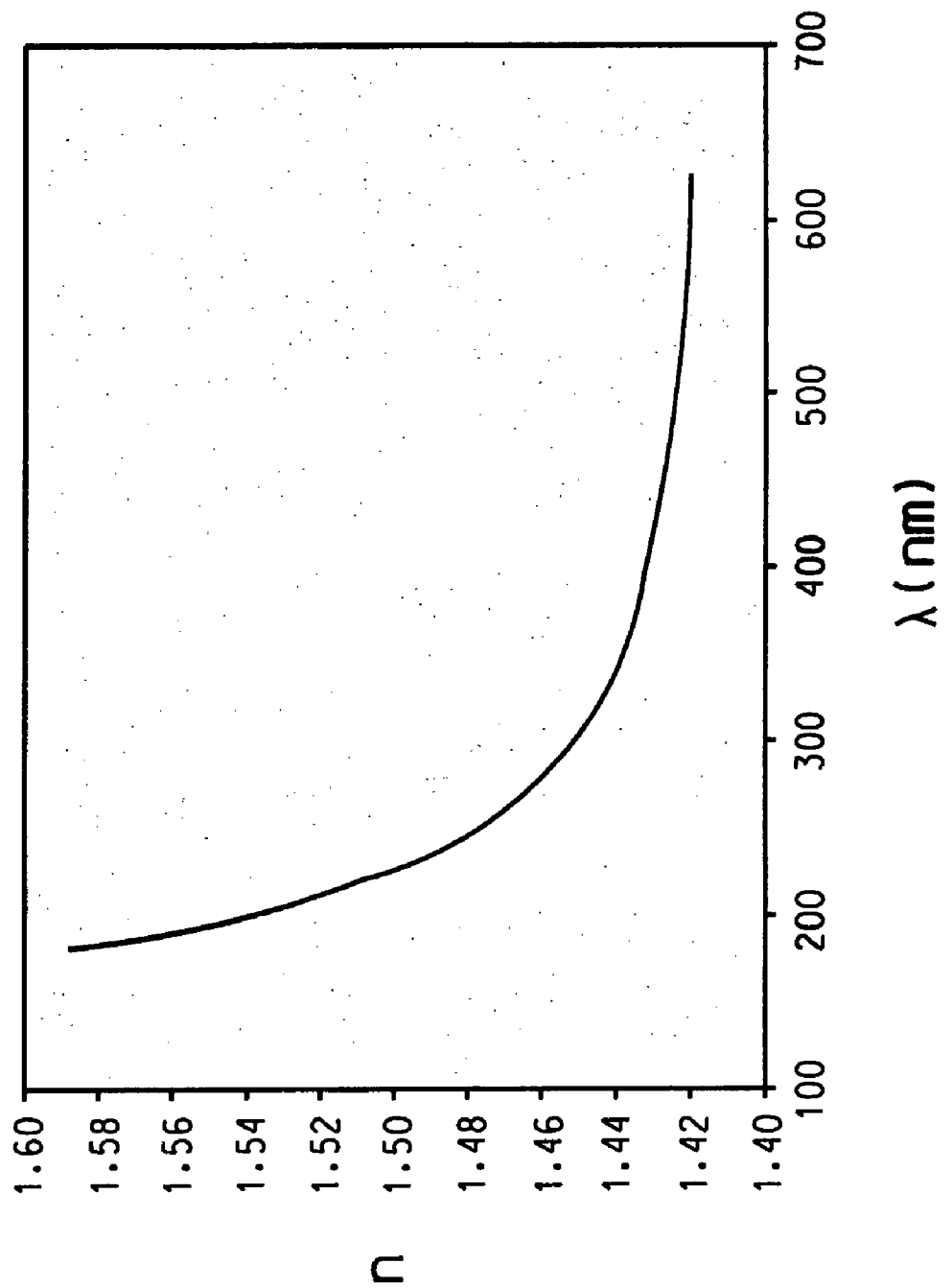
FIG. 9 shows the index of refraction in absolute units for cyclohexane versus wavelength lambda in units of nanometers.
Figure 10:
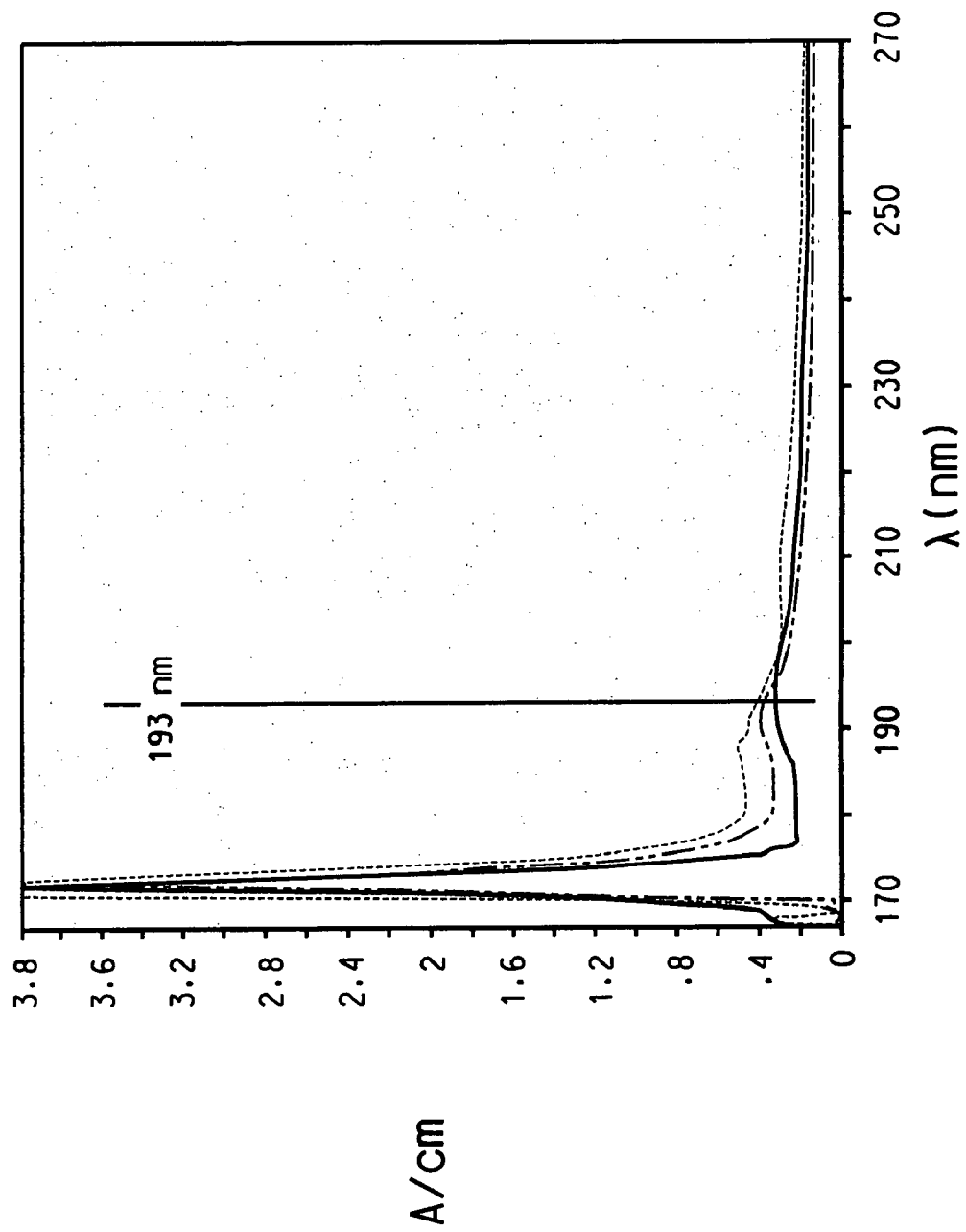
FIG. 10 the absorbance in units of inverse centimeters for cyclopentane versus wavelength lambda in units of nanometers for a sample a) as received, b) treated with 3A molecular sieves (dashed and dotted line), c) treated with silica gel (solid line).

D. The index of refraction of cyclohexane, was measured using the minimum deviation method discussed above. The index of refraction at 22° C. was 1.571 at 193 nm and 1.494 at 248 nm. The index of refraction at 32° C., was 1.56 at 193 nm and 1.48 nm at 248 nm as shown in Table 2 and FIG. 9.

E. Aluminum oxide (Aldrich catalog number 30,911-7, granular, 4-8 mesh) was dried at 500° C. for two hours under vacuum. About 5 ml of this aluminum oxide was added to 15 ml of the as received cyclohexane. After filtering the aluminum oxide off under N$_2$ in a glove box, the absorbance of the thus treated cyclohexane was found to be 0.35 cm$^{-1}$ by the relative transmission method at 193 nm.

Example 2

Cyclopentane

A. The absorbance of as received cyclopentane (Fluka (catalog # 29682, purity ⌊ 99.0% by GC, b.p. 50° C.) according to the relative transmission method hereinabove was found to be 0.42 cm$^{-1}$ at 193 nm.

B. About 10 g of the dried molecular sieves (3A) prepared in Example 1 were mixed with 20 ml of the as-received cyclopentane. After filtering the sieves off under N$_2$ in a glove box, the absorbance of the thus treated cyclopentane was found to be 0.37 cm$^{-1}$ by the relative transmission method at 193 nm.

C. About 10 ml of dried silica gel as provided in Example 1, were combined with 20 ml of the as received cyclopentane. After filtering the silica gel off under N2 in a glove box, the absorbance of the thus treated cyclohexane was found to have an absorbance of 0.30 cm$^{-1}$ by the relative transmission method at 193 nm.

Figure 11:
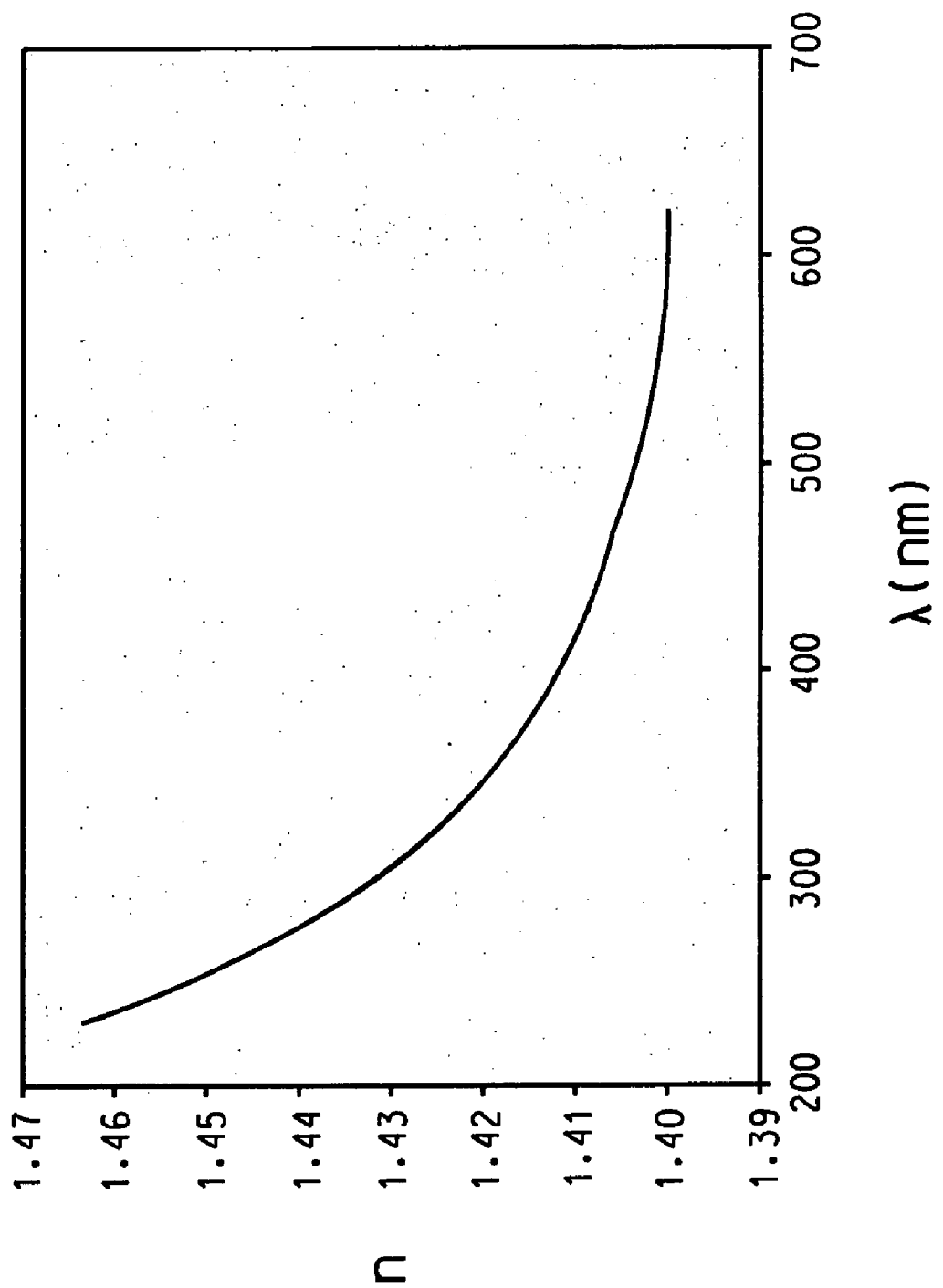
FIG. 11 shows the index of refraction in absolute units for cyclopentane versus wavelength lambda in units of nanometers.

D. The index of refraction of cyclopentane was measured using the minimum deviation prism method discussed above. The index of refraction 32° C. was 1.46 nm at 248 nm as shown in Table 2 and FIG. 11.

Example 3

The apparatus employed for performing contact photolithography at 193 nm is depicted in FIG. 5. It consisted of a a 193 nm Lambda-Physik (Ft. Lauderdale, Fla.) Optex ArF Excimer laser light source, a model D200 Scientech (5649 Arapahoe Avenue, Boulder, Colo. 80303) laser power meter, and an immersion fluid reservoir, all mounted on a 24" (61 cm)×18" (46 cm) optical table (Newport Corp., Irvine Calif.), positioned in a nitrogen flushed Nexus Dry Box (VAC Industries, Hawthorne Calif.) equipped with a trace oxygen analyzer and moisture probe (VAC Industries).

Test specimens were submerged 1 mm deep in the selected alkane liquid of the invention in the reservoir as shown in FIG. 6A. The laser beam traversed a distance of approximately 12" before being directed vertically downward towards the target surface as shown in FIGS. 4 and 5. The target surface was a 100 mm diameter×0.5 mm thick silicon wafer mounted in a an aluminum holder. The holder was mounted on a rail so that the sample assembly could be translated horizontally. A manually controlled shutter was placed in the beam path as shown. The Scientech power meter, as shown, was used to measure the total exposure energy per unit area. After monitoring a consistent energy of typically 0.2 milliJoules per cm2, the sample holder was slid into place.

Immersion fluid was dispensed into the reservoir of FIG. 6 using a glass hypodermic syringe, (Popper & Sons inc., New Hyde Park N.Y.) with a chrome Luer-Lock tip. Attached to the tip was a 0.2 micrometer PTFE membrane syringe filter, (Pall Gelman Laboratory, Ann Arbor, Mich.)

Sample Preparation

Single crystal silicon wafers, (Wafernet, Inc., San Jose Calif., 100 mm diameter×0.5 mm thick, polished on one side and having a natural oxide layer, approximately 2 nm thick, were prepared for 193 nm photolithography using the following procedure. The silicon wafers were coated in a YES-3 Vapor-Prime Oven (Yield Engineering Company, San Jose Calif.), with a layer of hexamethyldisilizane (HMDS) (Arch Chem. Ind, Norwalk, Conn.) used as an adhesion promoter for the photoresist.

The wafer was spin-coated with a photoresist polymer using a CEE Model 100CB Spinner/Hotplate, (Brewer Science Inc., Derby England). The photoresist was a terpolymer of 1) tetrafluoroethylene (TFE), 2) a norbornene fluoroalcohol (NBFOH), and 3) t-butyl acrylate (t-BAc) as represented by the structure

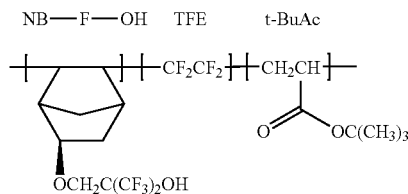

The polymer was prepared by free radical solution polymerization using peroxydicarbonate initiator and a hydrofluorocarbon solvent, as described in A. E. Feiring et al., "Design of Very Transparent Fluoropolymer Resists for Semiconductor Manufacture at 157 nm" Journal of Fluorine Chemistry, 122, 11-16, (2003). The photoresist polymer composition was 33% TFE, 43% NBFOH and 24% t-BA. The spinning solution for the formulated photoresist consisted of a 15 weight percent photoresist polymer dissolved in a 2-heptanone solvent with an additional 2 wt % of triphenylsulfonium nonaflate (TPS-Nf) present to serve as the photoacid generator (PAG) and 0.2 wt % of tetrabutylammonium lactate (TBA-Lac) to serve as the contrast enhancing base additive The weight percent is by weight of the total, including the weight of the spinning solvent. For details of this resist formulation and processing see M. K. Crawford et al., "Single Layer Fluoropolymer Resists for 157 nm Photolithography at 157 nm exposure wavelength", Advances in Resist Technology and Processing XVIII, SPIE Vol. 5039, (2003), and also A. E. Feiring et al., op. cit.

Approximately 1 ml of the photoresist solution so prepared was dispensed through a 0.2 micrometer polytetrafluoroethylene syringe filter. onto the HMDS vapor primed coated wafer and the wafer was spun-coated at 2500 rpm for 60 seconds in air and then a post apply bake (PAB) of the resist was done at 150° C. for 60 seconds The photoresist films were visually inspected and the thickness of each film measured using a FilMetrics film thickness instrument (Filmetrics Inc., San Diego Calif.).

1 ml of Teflon™ AF was dispensed onto the photoresist-coated wafer and the wafer was spun at 2500 rpm for 1 minute. The sample was then transferred into the VAC Dry Box and placed into the sample holder.

A contact mask was formed using SPI Copper TEM Grids, (SPI Inc. West Chester Pa.), 3 mm diameter×50 mesh, with a lateral periodicity of 500 micrometers, and line widths of 100 microns by placing the grids end to end across the entire wafer in the beam exposure path. The photoresist coated wafer was immersed to a fluid depth of approximately 1 mm by dispensing approximately 20 milliters of alkane immersion fluid of the invention through a glass syringe with a 0.2 micron filter over the entire 100 mm diameter of the top coat/photoresist/HMDS primed silicon wafer.

Sequential exposure was effected by physically translating the wafer into the exposure zone by ½ cm increments along a slide rail mounted on the optical table thereby providing a series of ½ cm strips of increasing dosage. After exposure the alkane immersion fluid of the invention was pipetted off and the contact masks were removed. The exposed wafer was then transferred out of the VAC Dry Box and post exposure baked at 135° C. for 60 seconds in air on the CEE Model 100CB Hotplate. The Top Coat was then removed from the wafer by spin cleaning on the CEE Model 100CB spinner, by dispensing FC-75 solvent over the top surface of the wafer, then spinning the wafer at 2500 rpm for 60 seconds in air. The thus exposed photoresist was then developed using Shipley LDD-26W Developer (Shipley Company, L.L.C., Marlborough Mass.), by immersion in the developer for 60 seconds at room temperature, in air. Then the sample was immersed in deionized (D.I.) water for 10 to 15 seconds, removed from the water bath, rinsed with a D.I. water spray and blown dry with nitrogen gas.

The dried samples were visually and microscopically inspected to determine the contact print dose, E1 Dry, which refers to the minimum exposure energy required for image formation in the absence of an immersion liquid; and to determine the contact print dose E1 Wet, which refers to the minimum exposure energy required for image formation in the presence of a given immersion liquid.

Example 3A

Figure 12:
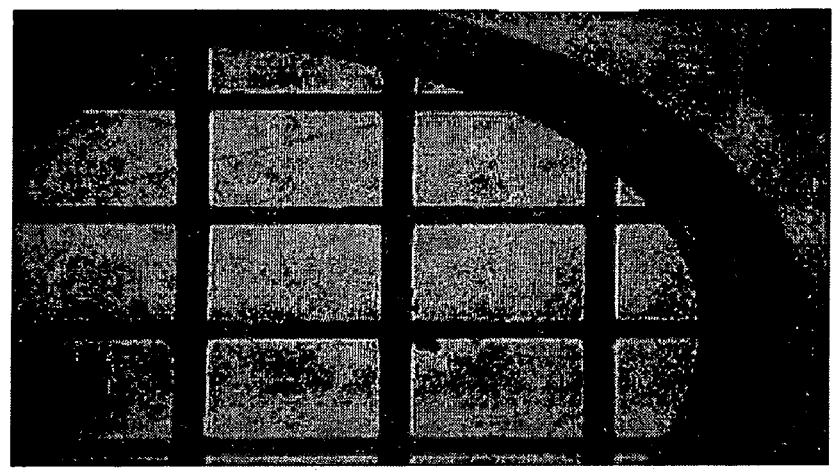
FIG. 12 shows a photograph of a photoresist image prepared using as received cyclohexane as an immersion liquid.

The photoresist layer prepared as described in the foregoing was 270 nm thick. The photoresist layer was coated with a topcoat as described above. The topcoat solution was prepared by combining 4.1 wt-% Teflon™ AF 1601 in FLUORINERT™ FC-75. The topcoat layer so prepared was 70 nm thick. The cyclohexane of Example 1B, with an optical absorbance of 4.78/cm was used as received as the immersion liquid. E1 was found to be 4 mJ/cm². At that dosage, the copper TEM grid pattern was clearly transferred to the silicon wafer as shown in FIG. 12.

Example 3B

Figure 13:
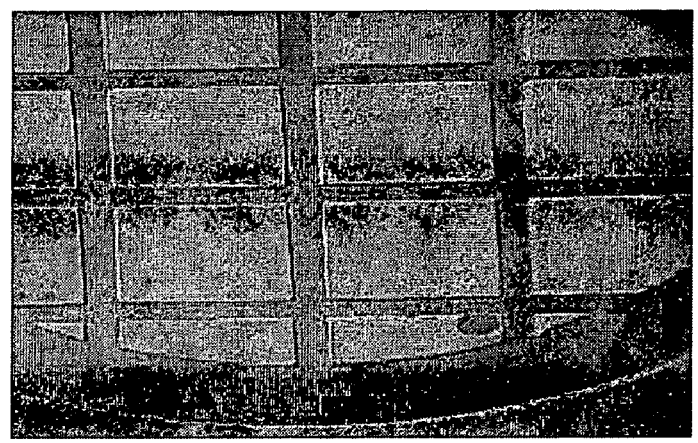
FIG. 13 shows a photograph of a photoresist image prepared using the low absorbance cyclohexane of the invention as an immersion fluid.

The procedure of Example 3A was repeated except in this case the immersion fluid was the purified cyclohexane of Example 1C characterized by an optical absorbance of 0.14/cm. The photoresist layer was 260 nm thick. The topcoat layer was 70 nm thick. E1 was found to be 1 mJ/cm². At that dosage, the copper TEM grid pattern was clearly transferred to the silicon wafer as shown in FIG. 13. Absorbance was reduced by 97% and E1 by 75%

Example 3C

Figure 14:
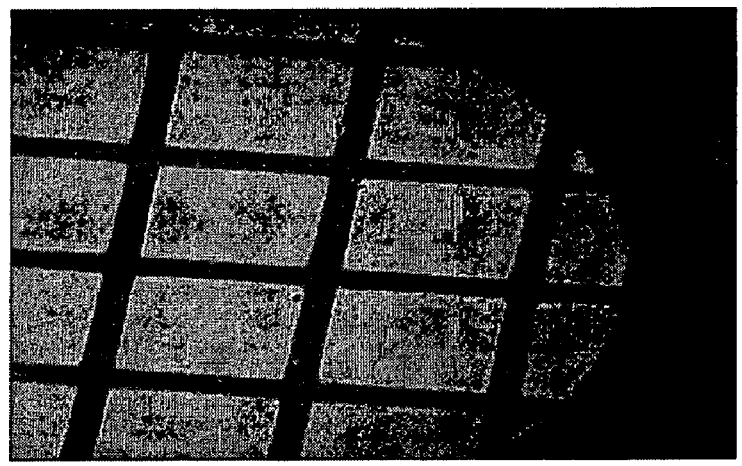
FIG. 14 shows a photograph of a photoresist image prepared using as received decahydronaphthalene as an immersion fluid.

The procedures of Example 3A were repeated except that the immersion fluid was as-received decahydronaphthalene, (decalin), characterized by an optical absorbance of 2.78/cm. and the topcoat was prepared as above from a about 5 wt % solution of a combination of poly(hexafluoropropylene and tetrafluoroethylene) in a weight ratio of 60:40, respectively, in FLUORINERT™ FC-75 solvent. The photoresist layer was 260 nm thick. The topcoat layer was 100 nm thick. E1 was found to be 1.6 mJ/cm². At that dosage, the copper TEM grid pattern was clearly transferred to the silicon wafer as is shown in FIG. 14.

Example 3D

Figure 15:
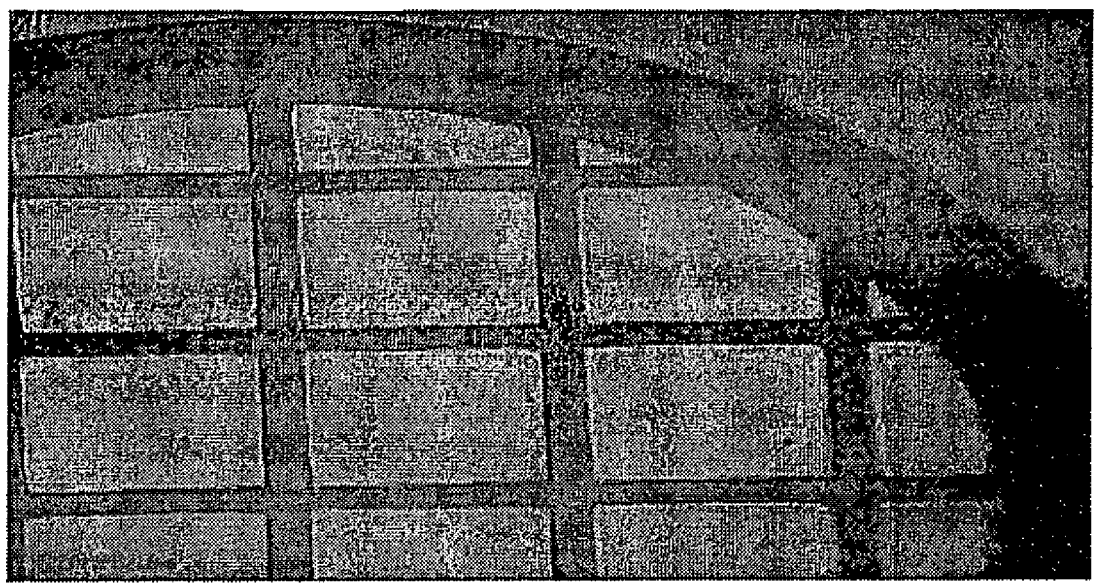
FIG. 15 shows a photograph of a photoresist image prepared using the decahydronaphthalene of the invention as an immersion fluid.

The procedures of Example 3C were repeated except that the immersion fluid was decahydronaphthalene, (decalin) treated using the procedures of Example 5B and characterized by an optical absorbance of 0.45 cm$^{-1}$. The photoresist layer was 260 nm thick. The topcoat layer was 100 nm thick. E1 was found to be 0.8 mJ/cm², at that dosage, the copper TEM grid pattern was clearly transferred to the silicon wafer as is shown in FIG. 15. Absorbance was reduced by 84% and E1 by 50%.

Comparative Example 2

Figure 16:
FIG. 16 shows a photograph of a photoresist image prepared without the use of an immersion fluid.

The same procedures were followed as in Example 3A except in this case no immersion fluid and no topcoat were used. The photoresist layer was 246 nm thick. E1 was found to be 1.2 mJ/cm² was required to effect clean image formation in the photoresist. The copper TEM grid pattern transferred to the wafer is shown in FIG. 16.

Example 4

A. The absorbance of as-received cyclooctane (Fluka Catalog number 29598, purity≧99.5% by GC. b.p. 150-152° C.) was tested according to the relative transmission method described herein above, and found to be 1.84 cm$^{-1}$ at 193 nm.

B. About 2 ml of the dried silica gel as provided in Example 1, was added to 5 ml of the as received cyclooctane. After filtering the silica gel off under N$_2$ in a glove box, the absorbance of the thus treated cyclooctane was found to be 1.13 cm$^{-1}$ at 193 nm using the relative transmission method.

Example 5

A. The absorbance of as received decalin, which was a mixture of cis and trans isomers (Fluka catalog number 30490, purity≧98% by GC). was measured under nitrogen using multiple path lengths according to the relative transmission method The as-received decalin was found to have an absorbance of 2.78 cm$^{-1}$ at 193 nm.

B. About 350 ml of dried silica gel as provided in Example 1 was added to 500 ml of the as received decalin. After filtering the silica gel off under N$_2$ in a glove box, the absorbance of the thus treated decalin was found to be 0.17 cm$^{-1}$ at 193 nm using the relative transmission method.

C. The index of refraction of decalin, was measured using the minimum deviation method discussed above. The index of refraction, at 22° C. was 1.641 at 193 nm and 1.546 at 248 nm, The index of refraction at 31° C. was 1.634 at 193 nm and 1.540 at 248 nm.

Example 6

A. The absorbance of as-received cis-decalin (Fluka catalog number 30500, purity≧98% by GC), was determined under nitrogen in the relative transmission method. The corrected absorbance at 193 nm was >300 cm$^{-1}$.

B. Silica gel powder (Fluka, catalogue number 60738, particle size 0.035-0.070 mm, 220-440 mesh ASTM) was dried at 500° C. under air for two hours. 50 ml of cis-decalin was eluted from a first column packed with 25 ml of the so-dried silica gel powder, followed by eluting from a second column packed with 15 ml of the silica gel powder. The absorbance of the so treated cis-decalin was found to be 0.75 cm$^{-1}$ at 193 nm using the relative transmission method.

C. The index of refraction of cis-decalin, was measured using the minimum deviation method discussed above. The index of refractionat at 22° C. was 1.656 at 193 nm and 1.560 at 248 nm, The index of refraction at 30° C. was 1.649 at 193 nm and 1.555 at 248 nm Example 7

A. The absorbance of as-received trans-decalin (Fluka catalog number 30510, purity≧98% by GC) was determined using a Varian Cary 5 UV/vis/NIR dual beam spectrometer following the procedure of Example 6. The corrected absorbance at 193 nm was 8.23 cm$^{-1}$.

B. 25 mL of trans-decalin was eluted from a column packed with 12 mL of the dried silica gel powder of Example 6. Its absorbance was found to be 0.46 cm$^{-1}$ at 193 nm using the relative transmission method.

C. The index of refraction of trans-Decalin, was measured using the minimum deviation method discussed above. The index of refraction at 22° C. was 1.643 at 193 nm and 1.548 at 248 nm. The index of refraction at 31° C. was 1.636 at 193 nm.

Example 8

A. The absorbance of as received 1,1'-bicyclohexyl (Fluka catalog # 14356, purity ⌊ 99.0% by GC), was found to be 31.40 cm$^{-1}$ at 193 nm. by the relative transmission method described herein.

B. About 10 ml of dried silica gel as provided in Example 1 was combined with 20 ml of the as received bicyclohexyl. After filtering the silica gel off under N$_2$ in a glove box, the absorbance was found to be 0.31 cm$^{-1}$ at 193 nm using the relative transmission method.

Example 9

A. A 400 ml autoclave was charged with 100 g of a mixture of endo and exo 5-vinyl-2-norbornene (Aldrich 14,867-9, 95%), 150 ml of methanol (Burdick & Jackson, HPLC grade), and palladium on activated carbon (1 g, Alfa products powder, containing 10% Pd) at room temperature. The autoclave was closed and sealed, then shaken under 50 psig hydrogen pressure for 1 hour at room temperature. The hydrogen pressure was gradually increased to 200 psig over the next hour at room temperature followed by 400 psig at 100° C. for 2 hour and 620 psig at 150° C. for 1 hour. After being cooled to room temperature, the reaction mixture was filtered to remove the catalyst. The filtrate divided into two layers. The bottom layer was isolated and washed with two 50 ml aliquots of water, dried over anhydrous granular $Na_2SO_4$ (EM Science). After removal of the $Na_2SO_4$, 79 g of liquid product was obtained, which is herein designated as product A. The top layer of the two layer reaction filtrate was mixed with 500 ml of water, thereby again forming a two layer liquid. The top layer so produced was isolated and washed with two 20 ml aliquots of water and dried over $Na_2SO_4$. After removal of $Na_2SO_4$, 19 g of liquid product was obtained which is herein designated as product B. Both product A and product B were found to consist of more than 99% of 2-ethylnorbornane. The combined yield was 96%. Trace amount of olefin contamination was found in both product A and product B. Both samples were treated with bromine (0.12 g, Aldrich, reagentplus grade)) overnight at room temperature. The excess bromine was removed by washing with $NaHSO_3$ (aq.) and water. After being dried over $Na_2SO_4$, the samples were combined and distilled at reduced pressure. The center fraction of the distillate (bp 106° C./185 mmHg) had absorbance at 193 nm of 61.4 $cm^{-1}$. This fraction was transferred to a clean bottle (VWR, VWR® TraceClean™ bottle with Teflon-lined closure) and purged with nitrogen. To the bottle was added activated silica gel as provided in Example 1 (about ⅓ of the volume of the liquid) in a dry box. The bottle was closed and shaken for about 30 seconds, then allowed to sit at room temperature for a few days. The liquid was filtered through an Acrodisc® CR 25 mm syringe filter with 200 nm PTFE membrane (Pall Life Science). The filtered liquid had absorbance of 1.83 $cm^{-1}$ at 193 nm. After a second such treatment, the fluid had absorbance of 0.98 $cm^{-1}$ at 193 nm.

B. Another batch of 2-ethylnorbornane was treated with silica gel three times as in Example 9-A. The resulting absorbance was 0.81 $cm^{-1}$ at 193 nm. The index of refraction of the thus treated 2-ethylnorbornane, was measured using the minimum deviation method discussed above. The index of refraction at 22° C. was 1.613 at 193 nm. The index of refraction at 31° C. was 1.607 at 193 nm and 1.525 at 248 nm.

Example 10

A. The absorbance of as-received n-octylcyclohexane (TCI-EP catalog number 00138, 98+%) was tested according to the relative transmission method hereinabove, and found to be 2.24 $cm^{-1}$ at 193 nm.

B. Silica gel (Aldrich catalog number 24,982-3, type 3, 8 mesh) was dried at 500° C. for two hours under air. Activated carbon (Calgon Carbon Corporation, Type CPG LF 12×40) was dried at 200° C. for two hours under nitrogen. About 4 ml of the thus dried silica gel and 3 ml of the thus dried activated carbon were added to 15 ml of the as received n-octylcyclohexane in a VWR TraceClean™ bottle in a glove bag under N2. The mixture of n-octylcylcohexane, activated carbon, and silica gel was allowed to stand for 6 days at room temperature in the sealed VWR™ TraceClean™ vial. The vial was transferred to a nitrogen glove box. A few ml of the n-octylcyclohexane were poured off the silica and carbon into a 15 ml BD syringe provided with a 0.45 micron Luer-Lok™ PTFE filter. The filtrate was collected in a clean VWR TraceClean™ vial. About 0.5 ml of the filtrate so obtained was transferred into the Harrick cell using a clean 1 ml BD glass syringe. The thus treated n-octylcyclohexane was found to have an absorbance of 1.78 $cm^{-1}$ at 193 nm by the relative transmission method herein above.

C. Silica Gel (Aldrich catalog number 24,982-3, type 3, 8 mesh) was dried at 500° C. for two hours under air. About 2 ml of this silica were added to 5 ml of the as received n-octylcyclohexane in a VWR TraceClean™ vial in a glove bag under an atmosphere of nitrogen. The vial was removed from the glove bag, given a shake, and let stand in the lab overnight. The next morning the vial was returned to the glove bag and the silica filtered off using an 0.45µ glass microfiber syringe filter (Whatman® Autovial® #AV125UGMF), the filtrate being collected in a fresh VWR TraceClean™ vial. The vial was taken to another lab, put in a new nitrogen glove bag, and transferred to a 0.5 cm cuvette with quartz windows. The absorbance of the n-octylcyclohexane was measured using a Varian Cary 5 UV/vis/NIR dual beam spectrometer using the procedure of Example 4. The corrected absorbance at 193 nm was 2.0.

Example 11

Decane

A. The absorbance of as-received decane (Aldrich catalog number 45,711-6, anhydrous, 99+%, packaged under nitrogen in a Sure/Seal™ bottle) was determined under nitrogen according to the VUV Vase absorbance method herein above, and found to be 3.43 $cm^{-1}$ at 193 nm.

B. Silica gel (Aldrich catalog number 24,982-3, type 3, 8 mesh) was dried at 500° C. for two hours under air. About 28 ml of this silica gel was added to 40 ml of the as received decane in a nitrogen glove bag. After filtering the silica gel off under $N_2$ in a glove box, the absorbance of the thus treated decane was found to be 0.54 $cm^{-1}$ at 193 nm using the VUV Vase absorbance by the method herein above.

C. The index of refraction of decane, was measured using the minimum deviation method discussed above. The index of refraction, at 22° C. was 1.549 at 193 nm and 1.476 at 248 nm.

D. The absorbance of a 10 ml sample of as received decane was measured using a Varian Cary 5 UV/vis/NIR dual beam spectrometer following the procedure of Example 4 with 1 cm cuvettes. The corrected absorbance at 193 nm was 3.12 $cm^{-1}$.

E. About 1 ml of silica dried as provided in Example 1 was combined with 10 ml of the as received n-decane in a glove bag under an atmosphere of nitrogen. The silica was filtered off in the glove bag under nitrogen using an 0.45µ glass microfiber syringe filter (Whatman® Autovial® #AV125UGMF). The absorbance of the thus treated decane was measured using a Varian Cary 5 UV/vis/NIR dual beam spectrometer following the procedure of Example 4 with 1 cm cuvettes. The corrected absorbance at 193 nm was 0.67 $cm^{-1}$.

F. The method of 11D was followed except that about 3 ml of dried silica gel was employed. The corrected absorbance at 193 nm was 0.61 $cm^{-1}$.

G. The method of 11D was followed except that about 5 ml of dried silica gel was employed. The corrected absorbance at 193 nm was 0.46 $cm^{-1}$.

H. The method of 11D was followed except that about 7 ml of dried silica gel was employed. The corrected absorbance at 193 nm was 0.29 $cm^{-1}$.

I. The method of 11D was followed except that about 9 ml of dried silica gel was employed. The corrected absorbance at 193 nm was 0.29 cm$^{-1}$.

Example 12

A. The absorbance of as received dodecane (Fluka catalog number 44010, purity>99.8% by GC) according to the relative transmission method hereinabove, and found to be 0.70 cm$^{-1}$ at 193 nm.

B. About 2 ml of dried silica gel as provided in Example 1. was added to 5 ml of the as received dodecane. After filtering the silica gel off under $N_2$ in a glove box, the absorbance of the thus treated dodecane was found to be 0.22 cm$^{-1}$ at 193 nm using the relative transmission method.

C. The index of refraction of dodecane, was measured using the minimum deviation method discussed above. The index of refraction at 22° C. was 1.564 at 193 nm and 1.489 at 248 nm. The index of refraction at 30° C. was 1.558 at 193 nm and 1.484 at 248 nm.

Example 13

A. The absorbance of a 5 ml sample of as received hexadecane (Fluka catalog number 52209, purity≧99.8% by GC) was found to be 6.15 cm$^{-1}$ at 193 nm by the relative transmission method described herein.

B. About 15 ml of dried silica gel as provided in Example 1 was added to 20 ml of the as received hexadecane. After filtering the silica gel off under $N_2$ in a glove box, the absorbance of the thus treated hexadecane was found to have an absorbance of 0.72 cm$^{-1}$ at 193 nm using the relative transmission method.

C. The index of refraction of hexadecane, was measured using the minimum deviation method discussed above. The index of refraction at 22° C. was 1.581 at 193 nm and 1.504 at 248 nm. The index of refraction at 32° C. was 1.573 at 193 nm.

Example 14

A. The absorbance of as received tetradecane (Fluka catalog number 87139, purity>99.5% by GC) was determined according to the relative transmission method hereinabove, and found to be 2.06 cm$^{-1}$ at 193 nm.

B. A 5 ml sample of the as received tetradecane was combined in a fresh sample vial with 2 ml of dried silica gel as provided in Example 1. After filtering the silica gel off under $N_2$ in a glove box, the absorbance of the thus treated tetradecane was found to be 1.00 cm$^{-1}$ at 193 nm using the relative transmission method.

Example 15

A. The absorbance of as received 2-methylpentane (Aldrich catalog # M6,580-7, purity 99+%, b.p. 62° C.) was found to be 43.33 cm$^{-1}$ at 193 nm using the relative transmission method.

B. About 12 ml of dried silica gel as provided in Example 1 was combined with 25 ml of the as received 2-methylpentane in a glove bag under $N_2$. After filtering the silica gel off under $N_2$ in a glove box, the absorbance of the thus treated 2-methylpentane was found to be 0.16 cm$^{-1}$ at 193 nm by the relative transmission method.

C. About 8 ml of dried silica gel as provided in Example 1 and 4 ml of 3A molecular sieves (EMD catalog #MX1583D-1, 8-12 mesh beads) that had been dried at 500° C. for two hours under air, were added to 25 ml of the as received 2-methylpentane in a glove bag under N2. After filtering the silica gel off under $N_2$ in a glove box, the absorbance of the thus treated 2-methylpentane was found to be 0.21 cm$^{-1}$ at 193 nm by the relative transmission method.

D. 4 ml of each of dried silica gel as provided in Example 1 and the dried molecular sieves of Example 13C and 4 ml of activated carbon (Calgon Carbon Corporation, Type CPG LF 12×40) which had been dried at 200° C. for two hours under nitrogen were added to 25 ml of the as received 2-methylpentane in a glove bag under N2. After filtering the silica gel, molecular sieves, and carbon off under $N_2$ in a glove box, the absorbance of the thus treated 2-methylpentane was found be 0.05 cm$^{-1}$ at 193 nm by the relative transmission method.

The index of refraction of 2-Methylpentane, was measured using the minimum deviation method discussed above. The index of refraction, at 22° C. was 1.495 at 193 nm and 1.429 at 248 nm.

E. The absorbance of a specimen treated exactly as that of Example 13B hereof was measured using the Varian Cary 5 spectrometer, and found to be 0.724 cm$^{-1}$.

Example 16

3-Methylpentane

A. The absorbance of as received 3-methylpentane (Aldrich catalog number M6,600-5, 99+%), was found to be 43.33 cm$^{-1}$ at 193 nm using the relative transmission method.

B. 8 ml of the silica gel and 7 ml of the carbon of Example 13 D were added to 30 ml of the as received 3-methylpentane in a glove bag under N2. After filtering the silica gel and carbon off under $N_2$ in a glove box, the absorbance of the thus treated 3-methylpentane was found to be 0.44 cm$^{-1}$ at 193 nm by the relative transmission method.

Example 17

2,3-Dimethylbutane

A. About 2 ml of dried silica gel as provided in Example 1 were combined with 5 ml of 2,3-dimethylbutane (Aldrich catalog number D15,160-2, 98+%) in a glove bag under an atmosphere of nitrogen. The silica was filtered off in the glove bag under nitrogen using an 0.45µ glass microfiber syringe filter (Whatman® Autovial® #AV125UGMF). The absorbance of the 2,3-dimethylbutane was measured using a Varian Cary 5 UV/vis/NIR dual beam spectrometer The corrected absorbance at 193 nm was 1.85 cm$^{-1}$.

B. The absorbance of the 2,3-dimethylbutane was determined in the as received state according to the relative transmission method hereinabove, and found to be 6.58 cm$^{-1}$ at 193 nm.

C. 8 ml of the silica gel and 7 ml of the carbon of Example 13 D were added to 30 ml of the as received 2,3-dimethylbutane in a glove bag under N2. After filtering the silica gel and carbon off under $N_2$ in a glove box, the absorbance of the thus treated 2,3-dimethylbutane was found to be 0.65 cm$^{-1}$ at 193 nm by the relative transmission method.

Example 18

A. The absorbance of as received 2,2-dimethylbutane (Fluka catalog # 39740, purity>99% by GC), was found to be 2.15 cm$^{-1}$ at 193 nm using the relative transmission method.

B. About 5 ml each of silica gel and 3A molecular sieves dried as in Example 13D were added to 20 ml of the as received 2,2-dimethylbutane. After filtering the silica gel and sieves off under $N_2$ in a glove box, the absorbance of the thus treated 2,2-dimethylbutane was found to be 0.46 cm$^{-1}$ at 193 nm by the relative transmission method.

C. About 10 ml of dried silica gel as provided in Example 1 was added to 20 ml of the as-received 2,2-dimethylbutane. After filtering the silica gel off under $N_2$ in a glove box, the absorbance of the thus treated 2,2-dimethylbutane was found to be 0.33 cm$^{-1}$ at 193 nm by the relative transmission method.

D. About 5 ml each of the dried silica and carbon prepared as in Example 13D were added to 20 ml of the as received 2,2-dimethylbutane in a glove bag under N2. After filtering the silica gel and carbon off under $N_2$ in a glove box, the absorbance of the thus treated 2,2-dimethylbutane was found to be 0.23 cm$^{-1}$ at 193 nm by the relative transmission method.

The index of refraction of 2,2-Dimethylbutane, was measured using the minimum deviation method discussed above. The index of refraction, at 30° C. was 1.481 at 193 nm and 1.415 at 248 nm. This corresponds to an effective lithography wavelength of 130.6 nm for 193 nm light and 175.3 nm for 248 nm light.

E. About 2 ml of dried silica gel as provided in Example 1 were added to 5 ml of the as received n-2,2-dimethylbutane in a glove bag under an atmosphere of nitrogen. The silica was filtered off in the glove bag under nitrogen using an 0.45µ glass microfiber syringe filter (Whatman® Autovial® #AV125UGMF). The absorbance of the 2,2-dimethylbutane was measured using a Varian Cary 5 UV/vis/NIR dual beam spectrometer. The corrected Absorbance at 193 nm was 0.424.

Example 19

A. The absorbance of as received cyclooctane (Aldrich catalog number C10, 940-1, purity>99+%). was found to be >100 cm$^{-1}$ at 193 nm. by the relative transmission method.

B. Silica gel powder (Fluka, catalogue number 60738, particle size 0.035-0.070 mm, 220-440 mesh ASTM) was dried at 500° C. under air for two hours. 100 mL of cyclooctane was eluted from a column packed with 50 mL silica gel powder dried above, followed by passing through a second column packed with 30 mL of freshly dried silica gel powder. Its absorbance/cm was found to be 0.47 cm$^{-1}$ at 193 nm using the relative transmission method.

The index of refraction of Cyclooctane, was measured using the minimum deviation method discussed above. The index of refraction, at 22° C. was 1.615 at 193 nm and 1.532 at 248 nm. At 30° C. the refractive index was 1.606 at 193 nm and 1.525 at 248 nm.

Example 20

A. The absorbance of as received decane (Fluka catalog number 30540, Purity ⌊ 99.8%, by GC) was found to be 6.01 at 193 nm by the relative transmission method.

B. About 5 ml of dried silica gel as provided in Example 1 was combined with 10 ml of the as received decane in a nitrogen glove bag. After filtering the silica gel off under $N_2$ in a glove box, the absorbance of the thus treated decane was found to be 0.56 cm$^{-1}$ at 193 nm using the relative transmission method.

Example 21

Cycloheptane

A. Cycloheptane was purchased from Fluka (catalog # 28810, Purity >97% by GC), b.p. 116-118° C. The absorbance of the cyclohpetane was measured using a Varian Cary 5 UV/vis/NIR dual beam spectrometer. Empty 100 um cuvettes with quartz windows were inserted in both beams and a zero baseline generated from 185 to 350 nm. The sample beam cuvette was removed from the Cary 5 spectrometer and loaded with the cyclohpetane in a nitrogen filled glove bag. The cuvette was returned to the Cary 5 spectrometer and absorbance measured from 185 to 350 nm. The deviation from zero baseline at 350 nm, where decane is non-absorbing, was then added to the absorbance measured at 193 nm as a final correction. The corrected absorbance at 193 nm was >390 cm$^{-1}$.

B. Silica gel powder (Fluka, catalogue number 60738, particle size 0.035-0.070 mm, 220-440 mesh ASTM) was dried at 500° C. under air. 100 mL of cyclopentane was eluted from a column packed with 50 mL silica gel powder dried above. Its absorbance was 49.89 cm$^{-1}$ at 193 nm.

C. After elution form a second silica gel column, the absorbance of the cycloheptane was found to be 0.95 cm$^{-1}$ at 193 nm using the to the Cary 5 spectrometer.

D. Silica gel (Aldrich catalog number 24,982-3, type 3, 8 mesh) was dried at 500° C. for two hours under air. About 7.5 ml of this silica gel was added to 10 ml of the above cycloheptane. After filtering the silica gel off under $N_2$ in a glove box, the absorbance of the thus treated cycloheptane was found to have an absorbance of 0.75 cm$^{-1}$ at 193 nm using the relative transmission method.

The index of refraction of Cycloheptane, was measured using the minimum deviation method discussed above. The index of refraction, at 22° C. was 1.598 at 193 nm and 1.517 at 248 nm. The index of refraction at 30° C. was 1.591 at 193 nm and 1.511 at 248 nm.

Example 22

Octahydroindene was prepared by literature procedure as described in Plate et al, Zhurnal Obshchei Khimii, 30, 3945-53, 1960. Octahydroindene (20 g) and concentrated sulfuric acid (15 g) was stirred at room temperature for 2 days. The top layer of the reaction mixture was isolated and washed with NaHCO3 (aq.), water and NaCl (sat.), dried over Na2SO4, then distilled to give a liquid (14.2 g, bp 35° C./2 mmHg). This liquid was added silica gel about ⅓ in volume in a VWR TraceClean™ bottle in a dry box. [Silica gel (Aldrich catalog number 24,982-3, type 3, 8 mesh) was dried at 500° C. for two hours under vacuum.] The bottle was closed and shaken for about 30 seconds, then allowed to sit at room temperature for a few days. The liquid was filtered through an Acrodisc® CR 25 mm syringe filter with 200 nm PTFE membrane (Pall Life Science). The filtered liquid had absorbance of 0.89 cm−1 at 193 nm by the relative transmission method herein above.

Example 23

A 54 gallon drum of exo-tetrahydrodicylcopentadiene was purchased from the Dixie Chemical Company, Inc., Houston, Tex. A small sample was transferred to a VWR TraceClean™ bottle under nitrogen. Its transparency was measured using a Varian Cary 5 UV/vis/NIR dual beam spectrometer and found to be 16 cm−1 at 193 nm.

A glass chromatograhpy column 1 inch in diameter, 12 inches tall, with a ~200 ml glass bulb up top protected by a positive pressure of nitrogen, and equipped with all Teflon™ grease free fittings, was connected to a nitrogen glove bag with ⅛" O. D. Teflon™ tubing. A small pad of glasswool was rinsed with Vertrel™ XF solvent, dried under nitrogen, and then used to pack the bottom of the glass chromatography column to prevent later clogging of the stopcock at the bottom.

About 80 ml of ICN Alumina N Akt. 1, catalog number 02084 was heated for 2 hours in a Hastelloy tube at 500° C. under a flow of air. The air flow was stopped, the tube sealed, and cooled to near room temperature. The alumina was then added to the chromatography column while purging the column slowly from the bottom with nitrogen.

About 240 ml of Dixie Chemical exo-tetrahyrodicyclopentadiene were added to the chromatography column containing the alumina. This column was purged with a slow N2 flow trickling up from the bottom of the column through the alumina and the exo-tetrahydrodicyclpentadiene for about one half hour.

Upon completion of the nitrogen purge, the exo-tetrahydrodicyclopentadiene was allowed to slowly elute from the column over several hours, passing via Teflon™ tubing directly to heat gun dried VWR TraceClean™ vials in a nitrogen filled glove bag. Successive cuts, each about 20 ml in volume, were taken. The absorbance of each cut was then measured under nitrogen using 1 cm cuvettes in a Varian Cary 5 UV/vis/NIR dual beam spectrometer. Absorption results are summarized in the table below.

| Cut # | Volume Eluted | A/cm @ 193 nm |
|---|---|---|
| 1 | 0-20 ml | 0.16 |
| 2 | 20-40 ml | 0.14 |
| 3 | 40-60 ml | 0.16 |
| 4 | 60-80 ml | 0.15 |
| 5 | 80-100 ml | 0.14 |
| 6 | 100-120 ml | 0.17 |
| 7 | 120-140 ml | 0.26 |
| 8 | 140-160 ml | 0.41 |
| 9 | 160-180 ml | 0.41 |

The refractive index of a similarly prepared sample of the exo-tetrahydrodicyclopentadiene was determined using the minimum deviation method discussed hereinabove to be 1.660 at 23° C. and 1.655 at 32° C. which had an absorbance/cm at 193 nm, measured by the relative transmission method, of 0.42/cm.

Example 24

Dissolved oxygen concentrations were measured by immersing an Ocean Optics FOXY Probe with an estimated resolution of 2 ppm below the surface of a liquid cyclohexane sample. Optical absorbances were measured at 193 nm by the relative transmission method, averaging the absorbances measured at two different Herrick cell thickness, (1.45 mm and 6.0 mm), in a VUV-Vase Spectrometer.

About 100 milliters of previously purified cyclohexane that had been stored over silica gel under nitrogen was syringed through a 0.2 μm Teflon™ filter into a 125 ml EaglePicher bottle in a nitrogen dry box. The 125 ml EaglePicher bottle had a silicon/Teflon™ septum cap and a Teflon™ coated stir bar inside. The cyclohexane filtrate thus prepared was found to have a dissolved oxygen concentration of 1.1 ppmw. The optical absorbance was 0.12 cm$^{-1}$.

The septum cap was removed and the contents of the bottle were exposed to the air for 15 minutes while being stirred. The bottle was capped once again with the septum, leaving the air trapped inside the bottle. The next morning the air saturated cyclohexane was found to have a dissolved oxygen concentration of 86 ppmw and an optical absorbance of 1.88 cm$^{-1}$.

A nitrogen gas line was introduced through the septum cap via a syringe needle that ran below the surface of the cyclohexane. Nitrogen was bubbled through the cyclohexane at a rate of 0.04 liters per minute for 210 seconds, excess nitrogen was vented through a second syringe needle penetrating the septum cap. The thus sparged cyclohexane had a dissolved oxygen concentration of 24.1 ppmw and an optical absorbance of 0.59/cm.

The cyclohexane was sparged a second time with nitrogen for 240 seconds. After this second sparging, the twice sparged cyclohexane had a dissolved oxygen concentration of 8.0 ppmw and an optical absorbance of 0.20/cm.

The cyclohexane was sparged a third time for 38 minutes. After this third sparging, the cyclohexane had a dissolved oxygen concentration of 0 ppmw (i.e., below the estimated detectability limit of ca. 2 ppm), and an optical absorbance of 0.27/cm.

Effect of Dissolved O2 Concentration on Cyclohexane Absorbance

| Sample | Abs./cm @193 nm | O2 Conc. ppmw +/− 2 ppm | Comment |
|---|---|---|---|
| A | 0.12 | 1.1 | Purified starting sample |
| B | 1.88 | 86.0 | Exposed to room air |
| C | 0.59 | 24.1 | Partial N2 sparge, 3.5 min. |
| D | 0.20 | 8.0 | Partial N2 sparge, 4 min. |
| E | 0.27 | 0 | Fully sparged, 38 min. |

The data in the table above suggests that each ppm of oxygen dissolved in the cyclohexane, will increase the measured absorbance of the cyclohexane by about 0.02 units at 193 nm. The effect of ≦1 ppm of dissolved oxygen is thus vanishingly small with respect to both the accuracy of our A/cm measurement (+/−0.02) and the limits claimed for an acceptably transparent fluid (A/cm is <1, preferably <0.1). According to Henry's law, it will take a massive dose of oxygen (>2300 ppm) in the nitrogen over a cyclohexane sample to push dissolved oxygen content in the cyclohexane above 1 ppmw. Levels of <2300 ppm oxygen in the gas phase above cyclohexane are easily achieved and maintained by our packing.

Why set the desired oxygen level to <2300 ppm? Long term, hydrocarbons such as cyclohexane O$_2$ oxidize creating powerful 193 nm chromophores that must be present at <1 ppm to maintain our absorbance specification. We want our packaging to protect the fluids indefinitely. Our packing method is designed to achieve and maintain oxygen levels characteristic of glove box or cylinder nitrogen, or, that is, about 2-5 ppm oxygen in the nitrogen phase above the cyclohexane. According to Henry's law, when nitrogen containing 5 ppm of oxygen is above cyclohexane, the dissolved oxygen concentration in the cyclohexane will be about 0.2 ppb (parts per billion). Maintaining 0.2 ppb or less of dissolved oxygen in the cyclohexane effectively eliminates the risk that the reaction of dissolved O2 with cyclohexane will measurably affect A/cm at 193 nm over time, (assuming a container in which the volume of nitrogen does not hugely exceed the volume of cyclohexane)

What is claimed is:

1. A composition consisting essentially of a liquid alkane having an oxygen concentration less than 2 ppm, and an absorbance at 193 nm wavelength of 1 cm$^{-1}$ or less wherein the liquid alkane is selected from: cyclopentane, cyclohexane, cycloheptane, n-decane, decahydronaphthalene racemate, cis-decahydronaphthalene, trans-decahydronaphthalene, exo-tetrahydrodicyclopentadiene, 1,1'-bicyclohexyl, 2-ethylnorbornane, n-dodecane, n-tetradecane, n-hexadecane, 2-methyl-pentane, 3-methyl pentane, 2,2-dimethyl butane, 2,3-dimethyl butane, octahydroindene, and mixtures thereof.

2. The composition of claim 1 wherein the liquid alkane is selected from: decahydronaphthalene racemate, cis-decahydronaphthalene, and trans-decahydronaphthalene, exo-tetrahydrodicyclopentadiene, and 1,1'-bicyclohexyl.

3. The composition of claim 1 wherein the absorbance is in the range of 0.01 to 1 cm$^{-1}$.

4. The composition of claim 3 wherein the absorbance is in the range of 0.01 to 0.5 cm$^{-1}$.

* * * * *

UNITED STATES PATENT AND TRADEMARK OFFICE
CERTIFICATE OF CORRECTION

PATENT NO. : 7,589,242 B2
APPLICATION NO. : 11/141285
DATED : September 15, 2009
INVENTOR(S) : French et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 572 days.

Signed and Sealed this

Twenty-first Day of September, 2010

David J. Kappos
*Director of the United States Patent and Trademark Office*